(12) United States Patent
Kamei et al.

(10) Patent No.: US 8,829,555 B2
(45) Date of Patent: Sep. 9, 2014

(54) SEMICONDUCTOR LIGHT EMISSION ELEMENT

(75) Inventors: Koji Kamei, Ichihara (JP); Remi Ohba, Ichihara (JP); Takashi Hodota, Ichihara (JP)

(73) Assignee: Toyoda Gosei Co., Ltd., Aichi (JP)

( * ) Notice: Subject to any disclaimer, the term of this patent is extended or adjusted under 35 U.S.C. 154(b) by 720 days.

(21) Appl. No.: 13/139,642

(22) PCT Filed: Dec. 14, 2009

(86) PCT No.: PCT/JP2009/070841
§ 371 (c)(1),
(2), (4) Date: Jun. 14, 2011

(87) PCT Pub. No.: WO2010/071113
PCT Pub. Date: Jun. 24, 2010

(65) Prior Publication Data
US 2011/0316037 A1  Dec. 29, 2011

(30) Foreign Application Priority Data

Dec. 15, 2008  (JP) .................. 2008-318700
Dec. 16, 2008  (JP) .................. 2008-320027
Mar. 30, 2009  (JP) .................. 2009-083126

(51) Int. Cl.
*H01L 33/62*  (2010.01)
*H01L 33/42*  (2010.01)
*H01L 33/32*  (2010.01)
*H01L 33/40*  (2010.01)

(52) U.S. Cl.
CPC .............. *H01L 33/42* (2013.01); *H01L 33/32* (2013.01); *H01L 33/40* (2013.01)
USPC ........ 257/99; 257/103; 257/E33.064; 257/57; 257/40

(58) Field of Classification Search
CPC . H01L 33/32; H01L 33/42; H01L 2933/0016; H01L 21/0254; H01L 2924/01049; H01L 2251/5323; H01L 51/5203; H01L 33/23; H01L 33/40
USPC ................ 257/99, 103, E33.064, 57, 40, 212, 257/E29.089
See application file for complete search history.

(56) References Cited

U.S. PATENT DOCUMENTS 5,943,559 A  8/1999  Maeda
7,344,903 B2  3/2008  Erchak et al.
(Continued)

FOREIGN PATENT DOCUMENTS

CN  1677703 A  10/2005
CN  1897318 A  1/2007
(Continued)

*Primary Examiner* — Cathy N Lam
(74) *Attorney, Agent, or Firm* — Sughrue Mion, PLLC

(57) ABSTRACT

A semiconductor light emission element (1) includes: a substrate (110); multi-layered semiconductor layers (100) including a light emission layer (150) and layered on the substrate (110); a transparent electrode (170) including an indium oxide and layered on the multi-layered semiconductor layers (100); a first junction layer (190) including tantalum as a valve action metal and layered on the transparent electrode (170) in such a manner that a side of the first junction layer (190) being in contact with the transparent electrode (170) is a tantalum nitride layer or a tantalum oxide layer; and a first bonding pad electrode (200) layered on the first junction layer (190) and used for electrical connection with outside. This improves a bonding property of the transparent electrode or the semiconductor layer with the connection electrode and reliability of the electrodes.

20 Claims, 16 Drawing Sheets

(56) References Cited

U.S. PATENT DOCUMENTS

| | | |
|---|---|---|
| 7,868,344 B2 | 1/2011 | Kang et al. |
| 7,947,521 B2 | 5/2011 | Goshonoo et al. |
| 8,115,212 B2 | 2/2012 | Miki et al. |
| 2005/0133803 A1 | 6/2005 | Seong et al. |
| 2005/0199895 A1 | 9/2005 | Seong et al. |
| 2006/0006402 A1 | 1/2006 | Hsieh |
| 2007/0020788 A1 | 1/2007 | Liu et al. |
| 2007/0034891 A1 | 2/2007 | Song |
| 2007/0080353 A1 | 4/2007 | Lee et al. |
| 2008/0029767 A1 | 2/2008 | Nagata et al. |
| 2008/0224168 A1 | 9/2008 | Lee et al. |
| 2008/0252205 A1 | 10/2008 | Young et al. |
| 2008/0293231 A1 | 11/2008 | Goshonoo et al. |
| 2008/0303055 A1 | 12/2008 | Seong |
| 2008/0305567 A1 | 12/2008 | Song |
| 2009/0124030 A1 | 5/2009 | Seong et al. |
| 2009/0184329 A1* | 7/2009 | Miki et al. ............ 257/79 |
| 2010/0308366 A1* | 12/2010 | Kang et al. ............ 257/99 |

FOREIGN PATENT DOCUMENTS

| | | |
|---|---|---|
| CN | 1917245 A | 2/2007 |
| CN | 101351898 A | 1/2009 |
| JP | 10-341039 A | 12/1998 |
| JP | 2001-44503 A | 2/2001 |
| JP | 2004-319672 A | 11/2004 |
| JP | 2005-209733 A | 8/2005 |
| JP | 2006-32952 A | 2/2006 |
| JP | 2008-41865 A | 2/2008 |
| JP | 2008-244161 A | 10/2008 |
| JP | 2008-244503 A | 10/2008 |
| KR | 10-0635157 B1 | 10/2006 |
| KR | 10-2007-0041506 A | 4/2007 |
| TW | 200605416 A | 2/2006 |
| WO | 2006011672 A1 | 2/2006 |
| WO | 2007/036850 A2 | 4/2007 |

* cited by examiner

FIG.4

|  | SPUTTER | | O₂ PLASMA PROCESSING ON TRANSPARENT ELECTRODE | ANNEALING | ADHESION |
| --- | --- | --- | --- | --- | --- |
|  | METAL OF JUNCTION LAYER | O₂ INTRO-DUCTION | | | |
| EXAMPLE 1 | Ta | DONE | N/A | N/A | B |
| EXAMPLE 2 | Ta | N/A | DONE | N/A | B |
| EXAMPLE 3 | Ta | DONE | N/A | DONE | A |
| EXAMPLE 4 | Ta | N/A | DONE | DONE | B |
| EXAMPLE 5 | Ta | DONE | DONE | DONE | A |
| EXAMPLE 6 | Nb | DONE | N/A | N/A | B |
| EXAMPLE 7 | Nb | N/A | DONE | N/A | B |
| EXAMPLE 8 | Nb | DONE | N/A | DONE | A |
| EXAMPLE 9 | Nb | N/A | DONE | DONE | B |
| EXAMPLE 10 | Nb | DONE | DONE | DONE | A |
| EXAMPLE 11 | Ti | DONE | N/A | N/A | B |
| EXAMPLE 12 | Ti | N/A | DONE | N/A | B |
| EXAMPLE 13 | Ti | DONE | N/A | DONE | A |
| EXAMPLE 14 | Ti | N/A | DONE | DONE | B |
| EXAMPLE 15 | Ti | DONE | DONE | DONE | A |
| COMPARATIVE EXAMPLE 1 | Ta | N/A | N/A | N/A | D |
| COMPARATIVE EXAMPLE 2 | Ta | N/A | N/A | DONE | C |
| COMPARATIVE EXAMPLE 3 | Nb | N/A | N/A | N/A | D |
| COMPARATIVE EXAMPLE 4 | Nb | N/A | N/A | DONE | C |
| COMPARATIVE EXAMPLE 5 | Ti | N/A | N/A | N/A | D |
| COMPARATIVE EXAMPLE 6 | Ti | N/A | N/A | DONE | C |

FIG.7

| | SPUTTER | | | OHMIC PROPERTY | ADHESION |
|---|---|---|---|---|---|
| | METAL OF JUNCTION LAYER | O₂ INTRO-DUCTION | N₂ INTRO-DUCTION | | |
| EXAMPLE 16 | Ta | DONE | N/A | B | A |
| EXAMPLE 17 | Nb | DONE | N/A | A | A |
| EXAMPLE 18 | Ti | DONE | N/A | B | A |
| EXAMPLE 19 | Ta | N/A | DONE | A | A |
| EXAMPLE 20 | Nb | N/A | DONE | B | A |
| EXAMPLE 21 | Ti | N/A | DONE | A | B |
| COMPARATIVE EXAMPLE 7 | Ta | N/A | N/A | A | C |
| COMPARATIVE EXAMPLE 8 | Nb | N/A | N/A | A | C |
| COMPARATIVE EXAMPLE 9 | Ti | N/A | N/A | A | C |

FIG.8

| | TARGET MATERIAL | N$_2$ CONCENTRA-TION (VOL%) | THICKNESS (Å) OF FIRST JUNCTION LAYER | ADHESION |
|---|---|---|---|---|
| EXAMPLE 22 | Ta | 3.0 | 100 | B |
| EXAMPLE 23 | | 5.0 | 100 | B |
| EXAMPLE 24 | | 7.5 | 20 | B |
| EXAMPLE 25 | | 7.5 | 100 | B |
| EXAMPLE 26 | | 7.5 | 250 | A |
| EXAMPLE 27 | | 7.5 | 400 | A |
| EXAMPLE 28 | | 7.5 | 700 | A |
| EXAMPLE 29 | | 7.5 | 1000 | A |
| EXAMPLE 30 | | 10 | 100 | B |
| EXAMPLE 31 | | 20 | 100 | A |
| EXAMPLE 32 | | 50 | 100 | A |
| COMPARATIVE EXAMPLE 10 | | 0.0 | 100 | C |
| COMPARATIVE EXAMPLE 11 | | 1.0 | 100 | C |

FIG.9

| | TARGET MATERIAL | N₂ CONCENTRA-TION (VOL%) | THICKNESS (Å) OF FIRST JUNCTION LAYER | ADHESION |
|---|---|---|---|---|
| EXAMPLE 33 | W | 3.0 | 100 | B |
| EXAMPLE 34 | | 5.0 | | B |
| EXAMPLE 35 | | 7.5 | | B |
| EXAMPLE 36 | | 10 | | A |
| EXAMPLE 37 | | 20 | | A |
| EXAMPLE 38 | | 50 | | A |
| COMPARATIVE EXAMPLE 12 | | 0.0 | | C |
| COMPARATIVE EXAMPLE 13 | | 1.0 | | C |

FIG.10

|  | TARGET MATERIAL | N₂ CONCENTRATION (VOL%) | THICKNESS (Å) OF FIRST JUNCTION LAYER | ADHESION |
|---|---|---|---|---|
| EXAMPLE 39 | Ti | 3.0 | 100 | B |
| EXAMPLE 40 | | 5.0 | | B |
| EXAMPLE 41 | | 7.5 | | B |
| EXAMPLE 42 | | 10 | | A |
| EXAMPLE 43 | | 20 | | A |
| EXAMPLE 44 | | 50 | | A |
| COMPARATIVE EXAMPLE 14 | | 0.0 | | C |
| COMPARATIVE EXAMPLE 15 | | 1.0 | | C |

SEMICONDUCTOR LIGHT EMISSION ELEMENT

TECHNICAL FIELD

The present invention relates to a semiconductor light emission element.

BACKGROUND ART

In recent years, a GaN-based compound semiconductor has become a focus of attention as a semiconductor material for a short-wavelength light emission element. A GaN-based compound semiconductor uses various oxides or III-V compounds starting with single-crystal sapphire as a substrate, and is formed on the substrate by metal organic chemical vapor deposition (MOCVD method), molecular beam epitaxy (MBE method) or the like.

In such a semiconductor light emission element using a GaN-based compound semiconductor, multi-layered semiconductor layers having an LED structure that is formed of an n-type semiconductor layer, a light emission layer and a p-type semiconductor layer are typically formed on a substrate. A transparent electrode and a pad electrode for bonding are then formed on the uppermost p-type semiconductor layer, while a pad electrode for bonding is formed on the n-type semiconductor layer exposed by removing a part of the p-type semiconductor layer and the light emission layer by means of etching or the like.

As a conventional art described in an official gazette, there is known a structure in which a pad electrode (connection electrode) for bonding having a certain degree of thickness is arranged in some region on a transparent electrode made of a metal oxide such as ITO (see Patent Literature 1). Additionally, this Patent Literature 1 describes that the pad electrode on the transparent electrode is formed of Au/Cr, and a pad electrode on an n-type nitride semiconductor layer is formed of Au/Cr.

CITATION LIST

Patent Literature

Patent Literature 1: Japanese Patent Application Laid-Open Publication No. 2008-244503

SUMMARY OF INVENTION

Technical Problem

Since Cr has a high bonding property with a group III nitride semiconductor such as GaN and with a transparent electrode such as indium tin oxide (ITO), it is conceivable that Cr is used as a component of a junction layer joining a pad electrode with a transparent electrode or a semiconductor layer.

However, using Cr for a junction layer is likely to cause air or moisture to enter the junction layer from outside, depending on environment of usage. The air or moisture having entered the junction layer may decompose the junction layer when applying current, and thereby shorten the life of the semiconductor light emission element.

An object of the present invention is to improve a bonding property of the transparent electrode or the semiconductor layer with the connection electrode and reliability of the electrodes.

Solution to Problem

A semiconductor light emission element to which the present invention is applied includes: a substrate; multi-layered semiconductor layers including a light emission layer and layered on the substrate; a transparent electrode including an indium oxide and layered on the multi-layered semiconductor layers; a junction layer including at least one element selected from valve action metals, the junction layer being layered on the transparent electrode in such a manner that a side of the junction layer being in contact with the transparent electrode includes at least any one of an oxide and a nitride of the element; and a connection electrode layered on the junction layer and used for electrical connection with outside.

In such a semiconductor light emission element, the junction layer may include at least one element selected from the group consisting of Al, Ti, Zn, Zr, Nb, W, Mg, Bi, Si, Hf and Ta.

When the junction layer includes a nitride of the element, the junction layer may include at least one element selected from the group consisting of Ta, W and Ti.

When the junction layer includes an oxide of the element, the junction layer may include at least one element selected from the group consisting of Ta, Nb and Ti.

Additionally, the connection electrode may have a bonding layer formed of any one of Au and Al or an alloy including any one of Au and Al.

The connection electrode further may include a barrier layer layered between the junction layer and the bonding layer, and the barrier layer may be formed of any one of Ag, Al, Ru, Rh, Pd, Os, Ir, Pt, Ti, W, Mo, Ni, Co, Zr, Hf, Ta and Nb or an alloy including any one of these metals.

Furthermore, the transparent electrode may include the indium oxide and a zinc oxide.

The multi-layered semiconductor layers may be formed of a group III nitride semiconductor.

In another aspect of the present invention, a semiconductor light emission element to which the present invention is applied includes: a substrate; multi-layered semiconductor layers formed of a group III nitride semiconductor having a light emission layer, the multi-layered semiconductor layers being layered on the substrate; a junction layer including at least one element selected from valve action metals, the junction layer being layered on one semiconductor layer among the multi-layered semiconductor layers in such a manner that a side of the junction layer being in contact with the one semiconductor layer includes at least any one of an oxide and a nitride of the element; and a connection electrode layered on the junction layer and used for electrical connection with outside.

In such a semiconductor light emission element, the junction layer may include at least one element selected from the group consisting of Al, Ti, Zn, Zr, Nb, Mg, Bi, Si, Hf and Ta.

The junction layer may include at least one element selected from the group consisting of Ta, Nb and Ti.

Additionally, the connection electrode may have a bonding layer formed of any one of Au and Al or an alloy including any one of Au and Al.

The connection electrode further may include a barrier layer layered between the junction layer and the bonding layer, and the barrier layer may be formed of any one of Ag, Al, Ru, Rh, Pd, Os, Ir, Pt, Ti, W, Mo, Ni, Co, Zr, Hf, Ta and Nb or an alloy including any one of these metals.

In further aspect of the present invention, a semiconductor light emission element to which the present invention is applied includes: a first semiconductor layer having a first conductivity type; a light emission layer layered on the first semiconductor layer; a second semiconductor layer layered on the light emission layer and having a second conductivity type opposite to the first conductivity type; a transparent electrode layered on the second semiconductor layer, the transparent electrode including an indium oxide and having transparency to light outputted from the light emission layer; a first junction layer including at least one element selected from valve action metals, the first junction layer being layered on the transparent electrode in such a manner that a side of the first junction layer being in contact with the transparent electrode includes at least any one of an oxide and a nitride of the element; a first connection electrode layered on the first junction layer and used for electrical connection with outside; a second junction layer including at least one element selected from valve action metals, the second junction layer being layered on the first semiconductor layer in such a manner that a side of the second junction layer being in contact with the first semiconductor layer includes at least any one of an oxide and a nitride of the element; and a second connection electrode layered on the second junction layer and used for electrical connection with outside.

In such a semiconductor light emission element, the first semiconductor layer may be formed of an n-type semiconductor layer using electrons as carriers, and the second semiconductor layer may be formed of a p-type semiconductor layer using positive holes as carriers.

The first junction layer and the second junction layer may include at least one element selected from the group consisting of Al, Ti, Zn, Zr, Nb, W, Mg, Bi, Si, Hf and Ta.

Additionally, the first junction layer and the second junction layer may include any one of an oxide and a nitride of the same element.

The first connection electrode and the second connection electrode may include any one of the same metal and the same alloy.

Furthermore, the transparent electrode may include the indium oxide and a zinc oxide.

The first semiconductor layer, the light emission layer and the second semiconductor layer may be formed of a group III nitride semiconductor.

Advantageous Effects of Invention

According to the present invention, it is possible to improve a bonding property of the transparent electrode or the semiconductor layer with the connection electrode and reliability of the electrodes.

BRIEF DESCRIPTION OF DRAWINGS

FIG. 4 is a table showing manufacturing conditions and evaluation results of the semiconductor light emission elements in Examples and Comparative Examples of the first example;

FIG. 7 is a table showing manufacturing conditions and evaluation results of the semiconductor light emission elements in Examples and Comparative Examples of the second example;

FIG. 8 is a table showing a relationship between various manufacturing conditions and evaluation results on adhesion in Examples 22 to 32 and Comparative Examples 10 and 11 in the third example;

FIG. 9 is a table showing a relationship between various manufacturing conditions and evaluation results on adhesion in Examples 33 to 38 and Comparative Examples 12 and 13 in the third example;

FIG. 10 is a table showing a relationship between various manufacturing conditions and evaluation results on adhesion in Examples 39 to 44 and Comparative Examples 14 and 15 in the third example;

DESCRIPTION OF EMBODIMENTS

An exemplary embodiment of the present invention will be described below in detail with reference to the accompanying drawings.

Figure 1:
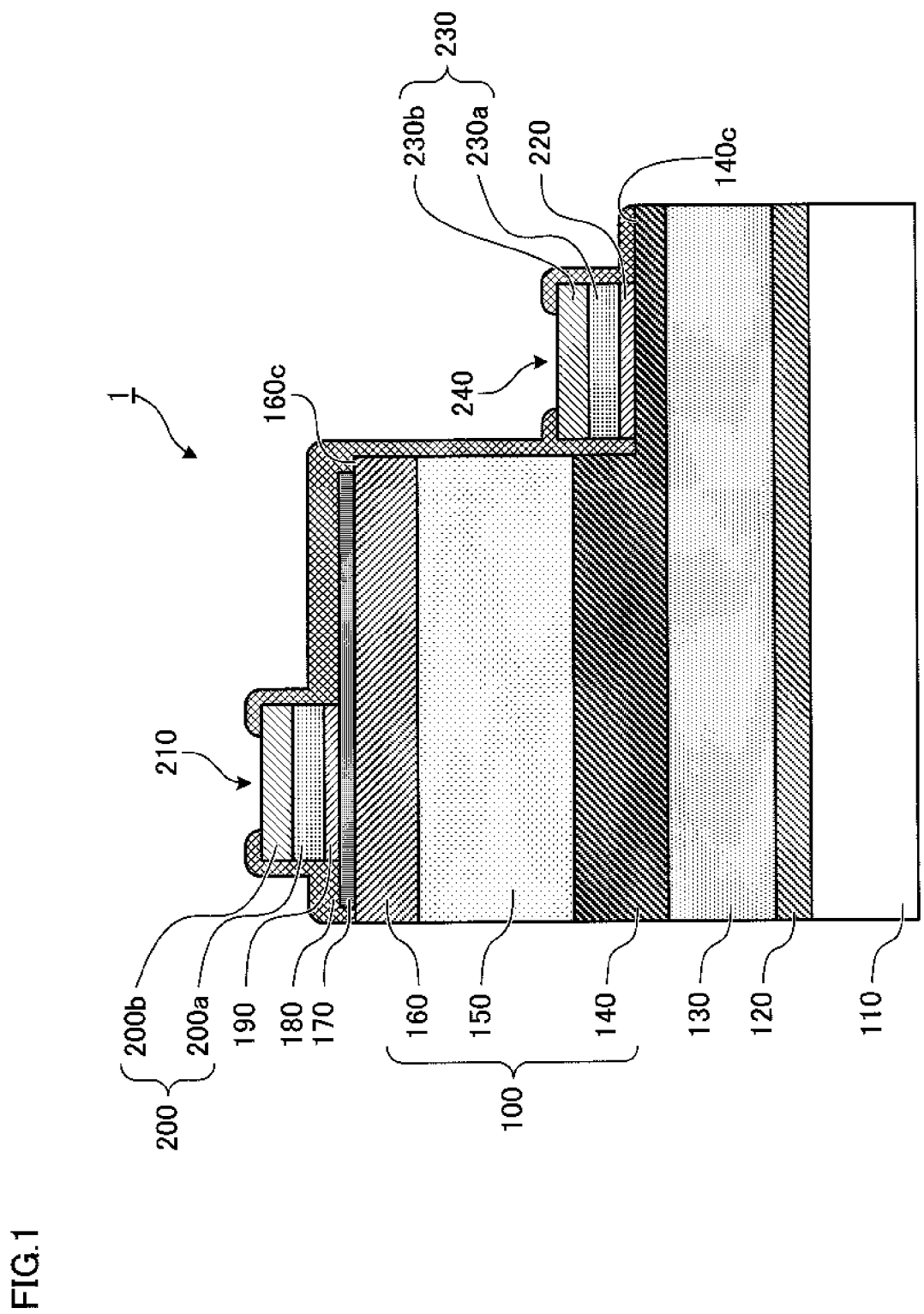
FIG. 1 is an example of a cross-sectional schematic diagram of a semiconductor light emission element.
Figure 2:
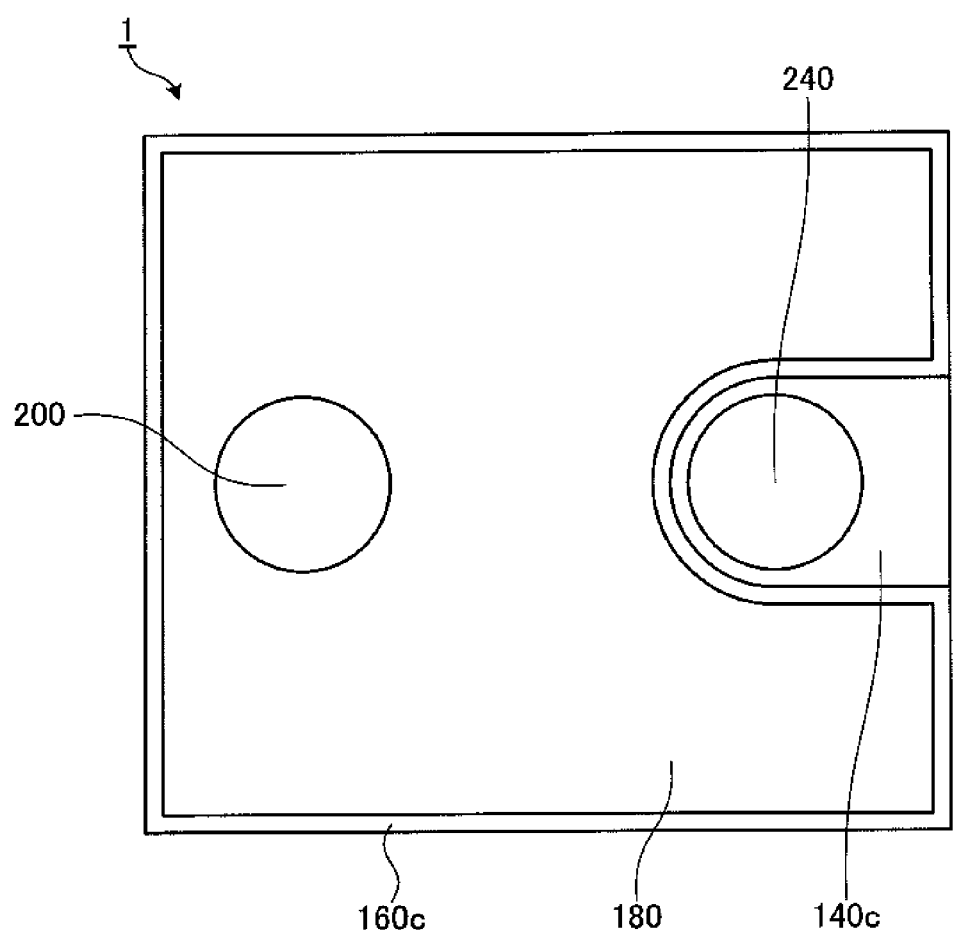
FIG. 2 is an example of a planar schematic diagram of the semiconductor light emission element.
Figure 3:
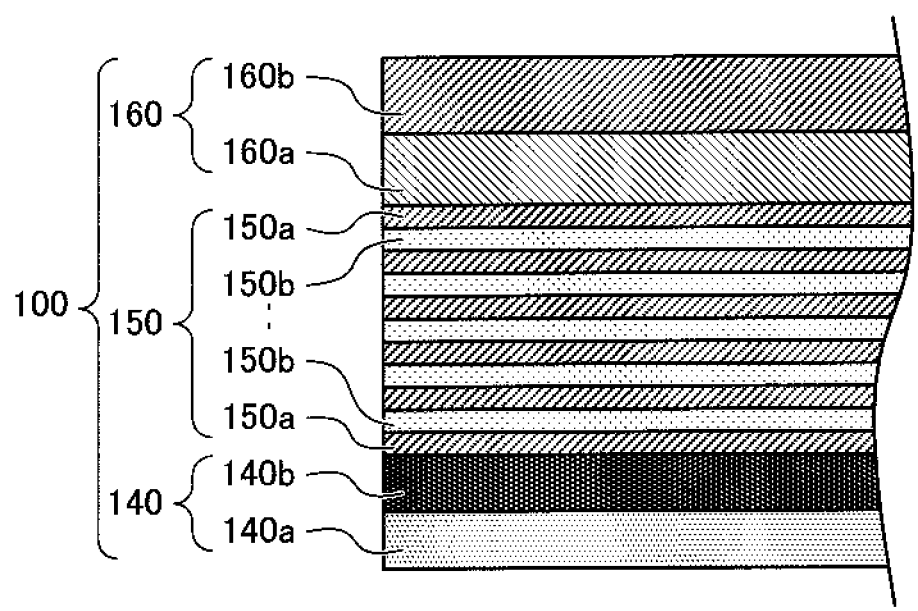
FIG. 3 is an example of a cross-sectional schematic diagram of multi-layered semiconductor layers forming the semiconductor light emission element.

FIG. 1 shows an example of a cross-sectional schematic diagram of a semiconductor light emission element (light emission diode) 1 to which the present exemplary embodiment is applied. FIG. 2 shows an example of a planar schematic diagram of the semiconductor light emission element 1 shown in FIG. 1. FIG. 3 shows an example of a cross-sectional schematic diagram of multi-layered semiconductor layers forming the semiconductor light emission element.

(Semiconductor Light Emission Element)

As shown in FIG. 1, the semiconductor light emission element 1 includes a substrate 110, an intermediate layer 120 layered on the substrate 110, and a base layer 130 layered on the intermediate layer 120. The semiconductor light emission element 1 also includes an n-type semiconductor layer 140 layered on the base layer 130, a light emission layer 150 layered on the n-type semiconductor layer 140, and a p-type semiconductor layer 160 layered on the light emission layer 150. Note that, in the following description, the n-type semiconductor layer 140, the light emission layer 150 and the p-type semiconductor layer 160 are collectively referred to as multi-layered semiconductor layers 100, as necessary. Additionally, the semiconductor light emission element 1 includes a transparent electrode 170 layered on the p-type semiconductor layer 160, and a protective layer 180 layered on the transparent electrode 170. The semiconductor light emission element 1 includes: a first junction layer 190 layered on that region of the transparent electrode 170 which is not covered with the protective layer 180; and a first bonding pad electrode 200 layered on the first junction layer 190. Furthermore, the semiconductor light emission element 1 includes: a second junction layer 220 layered on a part of a semiconductor-layer exposed surface 140c of the n-type semiconductor layer 140, the semiconductor-layer exposed surface 140c being exposed by cutting out a part of the p-type semiconductor layer 160, the light emission layer 150 and the n-type semiconductor layer 140; and a second bonding pad electrode 230 layered on the second junction layer 220. The protective layer 180 is also formed on the semiconductor-layer exposed surface 140c, and the second junction layer 220 is layered on that region of the semiconductor-layer exposed surface 140c which is not covered with the protective layer 180. Note that, in the following description, the transparent electrode 170, the first junction layer 190 layered on the transparent electrode 170, and the first bonding pad electrode 200 are correctively referred to as a first electrode 210. Additionally, in the following description, the second junction layer 220 and the second bonding pad electrode 230 are correctively referred to as a second electrode 240.

In the semiconductor light emission element 1, the first bonding pad electrode 200 in the first electrode 210 is used as a positive electrode while the second electrode 240 is used as a negative electrode, and a current flows via both the electrodes through the multi-layered semiconductor layers 100 (more specifically, the p-type semiconductor layer 160, the light emission layer 150 and the n-type semiconductor layer 140), which are an example of a power fed body, to thereby cause the light emission layer 150 to emit light.

Next, each of the components of the semiconductor light emission element 1 is described in more detail.

<Substrate>

The substrate 110 is not particularly limited as long as it is a substrate having a surface on which a group III nitride semiconductor crystal is epitaxially grown. The substrate 110 to be used may be selected from various substrates. For example, a substrate made of sapphire, SiC, silicon, zinc oxide, magnesium oxide, manganese oxide, zirconium oxide, manganese-zinc-iron oxide, magnesium-aluminum oxide, zirconium boride, gallium oxide, indium oxide, lithium-gallium oxide, lithium-aluminum oxide, neodium-gallium oxide, lanthanum-strontium-aluminum-tantalum oxide, strontium-titanium oxide, titanium oxide, hafnium, tungsten, molybdenum or the like may be used.

Among the above-mentioned substrates, it is particularly preferable to use a sapphire substrate with the c-plane thereof as a principal plane. If a sapphire substrate is used, the intermediate layer 120 (a buffer layer) may be formed on the c-plane of sapphire.

Among the above-mentioned substrates, an oxide substrate, a metal substrate and the like that are known to cause chemical denaturation by coming into contact with ammonia at a high temperature may be used. Instead, the intermediate layer 120 may be formed without using ammonia. Alternatively, in a method using ammonia, if the base layer 130 is formed in order to form the n-type semiconductor layer 140 to be described later, the intermediate layer 120 also works as a coat layer. Thus, these methods are effective to prevent chemical alteration of the substrate 110.

If the intermediate layer 120 is formed by the sputtering method, it is possible to keep the temperature of the substrate 110 at a low level. Thus, even if a substrate 110 made of a material having a property of decomposing at a high temperature is used, it is possible to form each layer on the substrate 110 without causing damage to the substrate 110.

<Multi-Layered Semiconductor Layers>

The multi-layered semiconductor layers 100 are layers made of a group III nitride semiconductor, for example, and are formed by layering the n-type semiconductor layer 140, the light emission layer 150 and the p-type semiconductor layer 160 on the substrate 110 in this order, as shown in FIG. 1.

Each of the n-type semiconductor layer 140, the light emission layer 150 and the p-type semiconductor layer 160 may be formed of plural semiconductor layers as shown in FIG. 3. Additionally, the multi-layered semiconductor layers 100 plus the base layer 130 and the intermediate layer 120 may be referred to as multi-layered semiconductor layers 100. The n-type semiconductor layer 140 conducts electricity with a first conductivity type using electrons as carriers, while the p-type semiconductor layer 160 conducts electricity with a second conductivity type using positive holes as carriers.

Formation by the MOCVD method gives multi-layered semiconductor layers 100 having favorable crystallinity. By optimizing conditions, the sputtering method may also allow for formation of semiconductor layers having more excellent crystallinity than the MOCVD method. Hereinafter, descriptions will be sequentially given.

<Intermediate Layer>

The intermediate layer 120 is preferably made of polycrystalline $Al_xGa_{1-x}N$ ($0 \leq x \leq 1$), and is more preferably made of single-crystal $Al_xGa_{1-x}N$ ($0 \leq x \leq 1$).

The intermediate layer 120 may be made of polycrystalline $Al_xGa_{1-x}N$ ($0 \leq x \leq 1$), for example, having a thickness of 0.01 to 0.5 µm, as described above. If the thickness of the intermediate layer 120 is less than 0.01 µm, an effect of reducing the difference in lattice constants between the substrate 110 and the base layer 130 may not be sufficiently obtained by the intermediate layer 120. If the thickness of the intermediate layer 120 exceeds 0.5 µm, processing time for forming the intermediate layer 120 may increase and thus productivity may decrease in spite of the fact that the function of the intermediate layer 120 does not change.

The intermediate layer 120 has a function of reducing the difference in lattice constants between the substrate 110 and the base layer 130, and facilitating formation of a single-crystal layer oriented in the c-axis on the (0001) plane (C-plane) of the substrate 110. Accordingly, if a single-crystal base layer 130 is layered on the intermediate layer 120, a base layer 130 having more favorable crystallinity can be layered. Note that in the present invention, implementation of an intermediate layer formation step is preferable, but is not necessary.

The intermediate layer 120 may have a crystal structure of a hexagonal system formed of a group III nitride semiconductor. A crystal of the group III nitride semiconductor forming the intermediate layer 120 may have a single-crystal structure, and a crystal having a single-crystal structure is preferably used. A crystal of a group III nitride semiconductor grows not only in an upper direction but also in an in-plane direction under controlled growth conditions, to thereby form a single-crystal structure. For this reason, controlling film formation conditions of the intermediate layer 120 may give the intermediate layer 120 made of a crystal of a group III nitride semiconductor having a single-crystal structure. If the intermediate layer 120 having such a single-crystal structure is formed on the substrate 110, a buffer function of the intermediate layer 120 effectively works and thus the group III nitride semiconductor formed thereon becomes a crystal film having favorable orientation and crystallinity.

Meanwhile, by controlling film formation conditions, the crystal of the group III nitride semiconductor forming the intermediate layer 120 may also be made to be a columnar crystal (polycrystal) formed of a texture based on a hexagonal column. Note that the columnar crystal formed of a texture herein refers to a crystal that is separated from an adjacent crystal grain by forming a crystal grain boundary therebetween and that itself has a columnar shape in the vertical section thereof.

<Base Layer>

For the base layer 130, $Al_xGa_yIn_zN$ ($0 \le x \le 1$, $0 \le y \le 1$, $0 \le z \le 1$, $x+y+z=1$) may be used. It is preferable to use $Al_xGa_{1-x}N$ ($0 \le x < 1$) because a base layer 130 having favorable crystallinity may be formed.

The film thickness of the base layer 130 is preferably 0.1 μm or more, more preferably 0.5 μm or more, and most preferably 1 μm or more. Setting the film thickness at more than this value tends to give an $Al_xGa_{1-x}N$ layer having favorable crystallinity.

To make crystallinity of the base layer 130 be favorable, it is desirable that the base layer 130 be not doped with dopant. However, if p-type or n-type conductivity is necessary, acceptor dopant or donor dopant may be doped.

<N-Type Semiconductor Layer>

As shown in FIG. 3, the n-type semiconductor layer 140, which is an example of a first semiconductor layer, is preferably formed of an n-contact layer 140a and an n-clad layer 140b. Note that the n-contact layer 140a may also serve as the n-clad layer 140b. Additionally, the above-mentioned base layer 130 may be included in the n-type semiconductor layer 140.

The n-contact layer 140a is a layer for providing the second electrode 240. The n-contact layer 140a is preferably formed of an $Al_xGa_{1-x}N$ layer ($0 \le x < 1$, preferably $0 \le x \le 0.5$, and more preferably $0 \le x \le 0.1$).

The n-contact layer 140a is preferably doped with n-type dopant. Containing n-type dopant at a concentration of $1 \times 10^{17}$ to $1 \times 10^{20}/cm^3$, preferably a concentration of $1 \times 10^{18}$ to $1 \times 10^{19}/cm^3$, is preferable in that the n-contact layer 140a can maintain a favorable ohmic contact with the second electrode 240. The n-type dopant is not particularly limited; however, Si, Ge, Sn and the like, preferably Si and Ge, are listed as examples thereof.

The film thickness of the n-contact layer 140a is preferably set at 0.5 to 5 μm, and is more preferably set in a range of 1 to 3 μm. If the film thickness of the n-contact layer 140a is in the above range, crystallinity of the semiconductor is kept favorable.

It is preferable to provide the n-clad layer 140b between the n-contact layer 140a and the light emission layer 150. The n-clad layer 140b is a layer to implement carrier injection and carrier confinement into the light emission layer 150. The n-clad layer 140b may be formed of AlGaN, GaN, GaInN or the like. Additionally, a heterojunction of these structures or a superlattice structure obtained by layering these structures several times may be employed. If the n-clad layer 140b is formed of GaInN, it is desirable that the band gap thereof be set larger than that of GaInN of the light emission layer 150.

The film thickness of the n-clad layer 140b is not particularly limited, but is preferably 0.005 to 0.5 μm, and more preferably 0.005 to 0.1 μm. The n-type dope concentration of the n-clad layer 140b is preferably $1 \times 10^{17}$ to $1 \times 10^{20}/cm^3$, and more preferably $1 \times 10^{18}$ to $1 \times 10^{19}/cm^3$. If the dope concentration is in these ranges, it is preferable in that favorable crystallinity is maintained and that an operating voltage of the element is reduced.

In a case where the n-clad layer 140b is made to be a layer including a superlattice structure, the n-clad layer 140b may include a structure in which an n-side first layer and an n-side second layer are layered, although detailed illustration thereof is omitted. Here, the n-side first layer is made of a group III nitride semiconductor having a film thickness of 100 angstroms or less. The n-side second layer is made of a group III nitride semiconductor having a composition different from that of the n-side first layer and having a film thickness of 100 angstroms or less.

Additionally, the n-clad layer 140b may include a structure in which the n-side first layers and the n-side second layers are alternately and repeatedly layered, and it is preferable that the structure be an alternating structure of GaInN and GaN, or an alternating structure of plural types of GaInN having compositions different from each other.

<Light Emission Layer>

The light emission layer 150 layered on the n-type semiconductor layer 140 may employ a single quantum well structure, a multiple quantum well structure, or the like.

For each of the well layers 150b having a quantum well structure as shown in FIG. 3, a group III nitride semiconductor layer made of $Ga_{1-y}In_yN$ ($0 < y < 0.4$) is typically used. The film thickness of each well layer 150b may be set at a film thickness enough to obtain quantum effect, for example, at 1 to 10 nm. It is preferable to set the film thickness at 2 to 6 nm from the viewpoint of light emission output.

In a case of the light emission layer 150 having a multiple quantum well structure, the above-mentioned $Ga_{1-y}In_yN$ is used as a well layers 150b, while $Al_zGa_{1-z}N$ ($0 \le z < 0.3$) having band gap energy larger than that of the well layers 150b is used as a barrier layers 150a. The well layers 150b and the barrier layers 150a may be doped with dopant according to design, but need not be doped.

<P-Type Semiconductor Layer>

As shown in FIG. 3, the p-type semiconductor layer 160, which is an example of a second semiconductor layer, is typically formed of a p-clad layer 160a and a p-contact layer 160b. The p-contact layer 160b may also serve as the p-clad layer 160a.

The p-clad layer 160a is a layer to implement carrier confinement and carrier injection into the light emission layer 150. The p-clad layer 160a is not limited to a particular one as long as it has a composition having band gap energy larger than that of the light emission layer 150 and allows for carrier confinement into the light emission layer 150; however, a p-clad layer 160a of $Al_xGa_{1-x}N$ ($0 < x \le 0.4$) is a preferable example.

A p-clad layer 160a formed of such AlGaN is preferable from the viewpoint of carrier confinement into the light emission layer 150. The film thickness of the p-clad layer 160a is not particularly limited, but is preferably 1 to 400 nm, and more preferably 5 to 100 nm.

The p-type dope concentration of the p-clad layer 160a is preferably $1 \times 10^{18}$ to $1 \times 10^{21}/cm^3$, and more preferably $1 \times 10^{19}$ to $1 \times 10^{20}/cm^3$. If the p-type dope concentration is in these ranges, favorable p-type crystals are obtained without reducing crystallinity.

Additionally, the p-clad layer 160a may have a superlattice structure obtained by being layered several times, and it is preferable to have an alternating structure of AlGaN and AlGaN, or an alternating structure of AlGaN and GaN.

The p-contact layer 160b is a layer for providing the first electrode 210. The p-contact layer 160b is preferably $Al_xGa_{1-x}N$ ($0 \le x \le 0.4$). If the Al composition is in the above range, it is preferable in that favorable crystallinity and a favorable ohmic contact with the first electrode 210 can be maintained.

Containing p-type dopant at a concentration of $1 \times 10^{18}$ to $1 \times 10^{21}/cm^3$, preferably a concentration of $5 \times 10^{19}$ to $5 \times 10^{20}/cm^3$, is preferable from the viewpoint of maintenance of a favorable ohmic contact, prevention of occurrence of a crack and maintenance of favorable crystallinity. The p-type dopant is not particularly limited; however, Mg is a preferable example.

The film thickness of the p-contact layer 160b is not particularly limited, but is preferably 0.01 to 0.5 μm, and more preferably 0.05 to 0.2 μm. If the film thickness of the p-contact layer 160b is in these ranges, it is preferable from the viewpoint of light emission output.

<First Electrode>

Next, a configuration of the first electrode 210 is described in detail.

As described above, the first electrode 210 has the transparent electrode 170, the first junction layer 190 layered on the transparent electrode 170, and the first bonding pad electrode 200 layered on the first junction layer 190.

<Transparent Electrode>

As shown in FIG. 1, the transparent electrode 170 is layered on the p-type semiconductor layer 160.

As shown in FIG. 2, when seen in a planar view, the transparent electrode 170 (see FIG. 1) is formed so as to cover almost all of a top surface 160c of the p-type semiconductor layer 160 that is partially removed by etching or the like to form the second electrode 240. However, the transparent electrode 170 is not limited to one having such a shape, but may have a grid form or a tree-like form with space in between. Note that, also for the structure of the transparent electrode 170, any structure including a conventionally known structure may be used without any limitations.

The transparent electrode 170 is preferably an electrode having a small contact resistance between the p-type semiconductor layer 160 and the transparent electrode 170. Additionally, since the semiconductor light emission element 1 has light from the light emission layer 150 extracted from the side on which the first electrode 210 is formed, the transparent electrode 170 is preferably an electrode having excellent light permeability. Furthermore, it is preferable that the transparent electrode 170 have excellent conductivity in order to diffuse a current uniformly over the whole surface of the p-type semiconductor layer 160.

In the present exemplary embodiment, a conductive material of an oxide including In is used for the transparent electrode 170. Some of oxides including In are preferable because they have excellent in both light permeability and conductivity as compared with other transparent conductive films. Listed as examples of conductive oxides including In are ITO (indium tin oxide ($In_2O_3$—$SnO_2$)), IZO (indium zinc oxide ($In_2O_3$—ZnO)), IGO (indium gallium oxide ($In_2O_3$—$Ga_2O_3$)), ICO (indium cerium oxide ($In_2O_3$—$CeO_2$)), and the like. Note that these may be doped with dopant such as fluorine, for example.

The transparent electrode 170 can be formed by providing these materials by use of a conventional methods well known in the art. After the transparent electrode 170 is formed, heat annealing may be performed in some cases for the purpose of transparentizing the transparent electrode 170.

In the present exemplary embodiment, a transparent electrode having a crystallized structure may be used for the transparent electrode 170. In particular, a translucent material (for example, ITO, IZO or the like) including an $In_2O_3$ crystal having a hexagonal structure or a bixbite structure may be preferably used.

For example, in a case where IZO including an $In_2O_3$ crystal having a hexagonal structure is used for the transparent electrode 170, an amorphous IZO film having an excellent etching property may be used and processed into a specific shape. After that, the IZO film may be further subjected to transition from the amorphous state to a structure including a crystal by heat treatment or the like, which allows for processing into an electrode having more excellent light transparency than an amorphous IZO film.

Additionally, it is preferable to use an IZO film having a composition with the lowest resistivity.

For example, the ZnO concentration in IZO is preferably in a range of 1 to 20 wt %, and is more preferably in a range of 5 to 15 wt %. A concentration of 10 wt % is particularly preferable. Meanwhile, the film thickness of the IZO film is preferably in a range of 35 to 10000 nm (10 μm) that makes it possible to obtain low resistivity and high light transmissivity. Furthermore, from the viewpoint of a production cost, the film thickness of the IZO film is preferably 1000 nm (1 μm) or less.

It is desirable to pattern the IZO film prior to a heat treatment step to be described later. Since an IZO film in the amorphous state is turned into a crystallized IZO film by heat treatment, it is more difficult to etch an IZO film subjected to heat treatment than an IZO film in the amorphous state. In contrast, since an IZO film prior to heat treatment is in the amorphous state, the IZO film can be easily etched with a high degree of accuracy by using well-known etchant (ITO-07N etchant (made by KANTO CHEMICAL CO., INC.)).

An IZO film in the amorphous state may be etched by using a dry etching apparatus. At this time, $Cl_2$, $SiCl_4$, $BCl_3$ or the like may be used for an etching gas. Heat treatment at 500 to 1000 degrees C., for example, and condition control may turn an IZO film in the amorphous state into an IZO film including an $In_2O_3$ crystal having a hexagonal structure or an IZO film including an $In_2O_3$ crystal having a bixbite structure. Since it is difficult to etch an IZO film including an $In_2O_3$ crystal having a hexagonal structure as described above, the above-mentioned etching is preferably followed by the heat treatment.

The heat treatment of the IZO film is desirably performed in an atmosphere including no $O_2$. An inert gas atmosphere, such as an $N_2$ atmosphere, a mixed gas atmosphere of $H_2$ and an inert gas, such as $N_2$, and the like are listed as examples of the atmosphere including no $O_2$. An $N_2$ atmosphere or a mixed gas atmosphere of $N_2$ and $H_2$ is desirably used. Note that if the heat treatment of the IZO film is performed in an $N_2$ atmosphere or a mixed gas atmosphere of $N_2$ and $H_2$, it is possible to effectively reduce sheet resistance of the IZO film and to crystallize the IZO film to form a film including an $In_2O_3$ crystal having a hexagonal structure, for example.

The heat treatment temperature of the IZO film is preferably 500 to 1000 degrees C. If the heat treatment is performed at a temperature lower than 500 degrees C., the IZO film may not be sufficiently crystallized and thus may not have a sufficiently high light transmissivity. If the heat treatment is performed at a temperature higher than 1000 degrees C., the IZO film is crystallized but may not have a sufficiently high light transmissivity. Additionally, if the heat treatment is performed at a temperature higher than 1000 degrees C., a semiconductor layer lying below the IZO film may be deteriorated.

When an IZO film in the amorphous state is crystallized, different film formation conditions and heat treatment conditions give different crystal structures in the IZO film. In the present exemplary embodiment, the material of the transparent electrode 170 is not limited to a particular one. However, a material having crystallinity is preferable from the viewpoint of adhesion to an adhesion layer. In particular, if the material is IZO having crystallinity, the material may be IZO including an $In_2O_3$ crystal having a bixbite crystal structure or IZO including an $In_2O_3$ crystal having a hexagonal structure. IZO including an $In_2O_3$ crystal having a hexagonal structure is particularly favorable.

In particular, as described above, an IZO film crystallized by heat treatment exhibits more favorable adhesion to the first junction layer 190 and the p-type semiconductor layer 160 than an IZO film in the amorphous state, and thus is extremely effective in the present exemplary embodiment.

<First Junction Layer>

The first junction layer 190, which is an example of a junction layer, is layered between the transparent electrode 170 and the first bonding pad electrode 200 in order to enhance bonding strength of the first bonding pad electrode 200 to the transparent electrode 170. The first junction layer 190 preferably has light transparency in order to allow light from the light emission layer 150 to transmit with a low loss, the light transmitting the transparent electrode 170 to be applied to the first bonding pad electrode 200.

It is preferable that the first junction layer 190 be formed of a valve action metal (valve metal), and is more preferable that the first junction layer 190 include at least one element selected from the group consisting of Al, Ti, Zn, Zr, W, Nb, Mg, Bi, Si, Hf and Ta and be layered on the transparent electrode 170 in such a manner that a side of the first junction layer 190 being in contact with the transparent electrode 170 includes at least any one of a nitride and an oxide of these elements. Alternatively, the first junction layer 190 may include a material obtained by partially nitriding or partially oxidizing a metal made of these elements. Thereby, the bonding strength between the transparent electrode 170 and the first bonding pad electrode 200 may be more improved as compared with a case where the first junction layer 190 is formed of a valve action metal itself.

Additionally, it is more preferable that the first junction layer 190 include at least one element selected from the group consisting of Ta, W and Ti and be layered on the transparent electrode 170 in such a manner that the side of the first junction layer 190 being in contact with the transparent electrode 170 includes a nitride of these elements. Alternatively, the first junction layer 190 may include a material obtained by partially nitriding a metal made of these elements. This is because the nitrided portion in the metal of the junction layer improves bonding strength with the transparent electrode 170, which is a metal oxide. In particular, since metals such as Ta, W and Ti has a property of being less likely to ionize among valve action metals, including nitrides of these metals is preferable in that this may prevent the metal elements for junction from ionizing and dissolving out due to an electrochemical reaction in the presence of water (moisture). Thereby, the bonding strength of the first bonding pad electrode 200 to the transparent electrode 170 can be significantly enhanced.

Additionally, all of the first junction layer 190, that is, the whole first junction layer 190 may be formed of a nitride of a valve action metal. However, it is only necessary that at least the side of the first junction layer 190 being in contact with the transparent electrode 170 is partially, locally or filmily formed of a nitride of a valve action metal. Accordingly, the first junction layer 190 may be formed of a valve action metal nitride layer formed on the side of the transparent electrode 170 and a valve action metal layer formed on the side of the first bonding pad electrode 200.

In this case, the first junction layer 190 is preferably a thin film having a thickness in a range of not less than 10 angstroms nor more than 2000 angstroms, and more preferably in a range of not less than 20 angstroms nor more than 1000 angstroms. This allows light from the light emission layer 150 to effectively transmit without being blocked. Note that if the thickness is less than 10 angstroms, the strength of the first junction layer 190 decreases and this may lead to decrease in the bonding strength of the first bonding pad electrode 200 to the transparent electrode 170. It is preferable that the thickness of the metal nitride layer in the first junction layer 190 be about 5 to 50 angstroms. A thickness of 5 angstroms or less may reduce an effect of improving the bonding strength with the transparent electrode 170, while a thickness of 50 angstroms or more may lead to decrease in conductivity between the first junction layer 190 and the transparent electrode 170. Additionally, it is not preferable for the thickness of the metal nitride layer to be 200 angstroms or more, because the transmissivity and the reflectivity of light are decreased.

Additionally, it is more preferable that the first junction layer 190 include at least one element selected from the group consisting of Ta, Nb and Ti and be layered on the transparent electrode 170 in such a manner that the side of the first junction layer 190 being in contact with the transparent electrode 170 includes an oxide of these elements. Alternatively, the first junction layer 190 may include a material obtained by partially oxidizing a metal made of these elements. This is because the oxidized portion in the metal forming the first junction layer 190 improves bonding strength with the transparent electrode 170, which is a metal oxide. In particular, since metals such as Ta, Nb and Ti has a property of being less likely to ionize among valve action metals, including oxides of these metals is preferable in that this may prevent the metal elements for junction from ionizing and dissolving out due to an electrochemical reaction in the presence of water (moisture). Thereby, the bonding strength of the first bonding pad electrode 200 to the transparent electrode 170 can be significantly enhanced.

Additionally, all of the first junction layer 190, that is, the whole first junction layer 190 may be formed of an oxide of a valve action metal. However, it is only necessary that at least the side of the first junction layer 190 being in contact with the transparent electrode 170 is partially, locally or filmily formed of an oxide of a valve action metal. Accordingly, the first junction layer 190 may be formed of a valve action metal oxide layer formed on the side of the transparent electrode 170 and a valve action metal layer formed on the side of the first bonding pad electrode 200.

In this case, the first junction layer 190 is preferably a thin film having a thickness in a range of not less than 5 angstroms nor more than 1000 angstroms, and more preferably in a range of not less than 10 angstroms nor more than 400 angstroms. This allows light from the light emission layer 150 to effectively transmit without being blocked. Note that if the thickness is less than 5 angstroms, the strength of the first junction layer 190 decreases and this may lead to decrease in the bonding strength of the first bonding pad electrode 200 to the transparent electrode 170. It is preferable that the thickness of the metal oxide layer in the first junction layer 190 be about 5 to 50 angstroms. A thickness of 5 angstroms or less may reduce an effect of improving the bonding strength with the transparent electrode 170, while a thickness of 50 angstroms or more may lead to decrease in conductivity between the first junction layer 190 and the transparent electrode 170.

<First Bonding Pad Electrode>

As shown in FIG. 1, the first bonding pad electrode 200, which is an example of a connection electrode and a first connection electrode, is formed of a laminate in which a first barrier layer 200a and a first bonding layer 200b are layered in the order from the side of the transparent electrode 170. The first barrier layer 200a, which is an example of a barrier layer, functions as a barrier to migration of the element forming the first bonding layer 200b, while the first bonding layer 200b, which is an example of a bonding layer, has a function of enhancing adhesion to a material of an external terminal for feeding.

Note that the first bonding pad electrode 200 may have a single-layer structure formed of only the first barrier layer 200a, or have a three-layer structure in which another barrier layer enhancing strength of the whole first bonding pad electrode 200 is interposed between the first barrier layer 200a and the first bonding layer 200b. Alternatively, the first bonding pad electrode 200 may have a two-layer structure with a barrier layer interposed instead of the first barrier layer 200a.

<First Barrier Layer>

The first barrier layer 200a shown in FIG. 1 has a function of enhancing the strength of the whole first bonding pad electrode 200. For this reason, it is preferable to use a relatively firm metal material, and the first barrier layer 200a may be selected from those formed of, for example, any one of Ag, Al, Ru, Rh, Pd, Os, Ir, Pt, Ti, W, Mo, Ni, Co, Zr, Hf, Ta and Nb or an alloy including any one of these metals. Additionally, the first barrier layer 200a is preferably formed of a metal having a high reflectivity in order to reflect light emitted from the light emission layer 150, and is more preferably formed of: a platinum metal, such as Ru, Rh, Pd, Os, Ir and Pt; Al, Ag or Ti; or an alloy including at least one of these metals. Thereby, the light from the light emission layer 150 can be effectively reflected.

Among these metals, Al, Ag and Pt and an alloy including at least one of these metals are typical materials for an electrode, and are excellent in availability, handleability and the like.

If the first barrier layer 200a is formed of a metal having a high reflectivity, it is desirable that the thickness thereof be 200 to 3000 angstroms. Making the first barrier layer 200a too thin does not give a sufficient effect of reflection. On the other hand, making the first barrier layer 200a too thick gives no advantage and only leads to an increase in process time and a waste of material. It is further desirable that the thickness be 500 to 2000 angstroms.

Additionally, it is preferable for the first barrier layer 200a to be in close contact with the first junction layer 190 in that the light from the light emission layer 150 is efficiently reflected and the bonding strength with the first bonding pad electrode 200 can be enhanced. In order for the first bonding pad electrode 200 to obtain enough strength, the first barrier layer 200a need to be firmly joined with the transparent electrode 170 through the first junction layer 190. At the minimum, it is preferable to have strength enough not to peel off in the step for connecting a gold wire to the bonding pad by a typical method. In particular, any one of Rh, Pd, Ir and Pt or an alloy including at least one of these metals is preferably used for the first barrier layer 200a from the viewpoint of reflectivity of light.

The reflectivity of the first bonding pad electrode 200 greatly varies depending on the composition material of the first barrier layer 200a, but is desirably 60% or more. The reflectivity is further desirably 80% or more, and more desirably 90% or more. The reflectivity may be relatively easily measured with a spectrophotometer or the like. However, since the first bonding pad electrode 200 itself has a small area, it is difficult to measure the reflectivity thereof. Thus, for example, a method may be employed in which "a dummy substrate" that is transparent, made of glass, for example, and has a large area is placed into the chamber on the occasion of forming the bonding pad electrode, and an identical bonding pad electrode is formed on the dummy substrate at the same time, with which the measurement is made.

<First Bonding Layer>

The first bonding layer 200b shown in FIG. 1 is preferably formed of any one of Au and Al or an alloy including at least one of these metals. Since Au and Al are metals having favorable adhesion to a gold ball that is often used as a bonding ball, using any one of Au and Al or an alloy including at least one of these metals allows the first bonding layer 200b to be excellent in adhesion to a bonding wire. Among these metals, Au is particularly desirable.

The thickness of the first bonding layer 200b is preferably in a range of not less than 500 angstroms nor more than 20000 angstroms, and is further desirably not less than 5000 angstroms nor more than 15000 angstroms.

Making the first bonding layer 200b too thin leads to unfavorable adhesion to a bonding ball, while making the first bonding layer 200b too thick gives no advantage and only leads to an increase in cost.

Light toward the first bonding pad electrode 200 is reflected on the first barrier layer 200a of the lowermost surface of the first bonding pad electrode 200 (the surface on the side of the transparent electrode 170). Some of the light is scattered to travel in the lateral direction or an oblique direction, while the other travels under the first bonding pad electrode 200. The light having been scattered and traveling in the lateral direction or an oblique direction is extracted outside from the side surface of the semiconductor light emission element 1. On the other hand, the light traveling in the direction under the first bonding pad electrode 200 is further scattered or reflected on the undersurface of the semiconductor light emission element 1, and is then extracted outside through the side surface and the transparent electrode 170 (a portion thereof on which the first bonding pad electrode 200 does not exist).

The first junction layer 190 and the first bonding pad electrode 200 layered thereon may be formed anywhere as long as they are on the transparent electrode 170. For example, the first junction layer 190 and the first bonding pad electrode 200 may be formed at a position furthest from the second electrode 240, or at the center of the semiconductor light emission element 1. However, it is not preferable to be formed at a position too close to the second electrode 240, because this causes a short circuit between wires or balls when bonding is made.

Meanwhile, as for the electrode area of the first bonding pad electrode 200, if the area is made to be as large as possible, bonding operations become easy but extraction of emitted light is prevented. For example, covering more than half of the area of the chip surface prevents extraction of emitted light, and thus greatly decreases output. In contrast, an excessively small area makes bonding operations less easy, and thus decreases yields of products.

Specifically, the first bonding pad electrode 200 preferably have a size of the order slightly larger than the diameter of the bonding ball, and is typically a circle having a diameter of about 100 μm.

<Second Electrode>

Subsequently, an example of a configuration of the second electrode 240 is described in detail.

As described above, the second electrode 240 includes the second junction layer 220 and the second bonding pad electrode 230 layered on the second junction layer 220.

As shown in FIG. 1, the second electrode 240 is formed on the semiconductor-layer exposed surface 140c of the n-type semiconductor layer 140. In this manner, when the second electrode 240 is formed, a part of the light emission layer 150 and the p-type semiconductor layer 160 is cut out and removed by etching or the like, to thereby expose the n-contact layer 140a of the n-type semiconductor layer 140, and then the second electrode 240 is formed on the semiconductor-layer exposed surface 140c thus obtained.

As shown in FIG. 2, when seen in a planar view, the second electrode 240 is circular. However, the second electrode 240 is not limited to one having such a shape, but may have an arbitrary shape such as a polygon. Additionally, the second electrode 240 also serves as a bonding pad, and is able to be connected with a bonding wire.

<Second Junction Layer>

The second junction layer 220 is layered between the n-contact layer 140a and the second bonding pad electrode 230 in order to enhance bonding strength of the second bonding pad electrode 230 to the semiconductor-layer exposed surface 140c formed on the n-contact layer 140a of the n-type semiconductor layer 140. Note that, in the present exemplary embodiment, the n-contact layer 140a corresponds to one semiconductor layer.

Similarly to the first junction layer 190, it is preferable that the second junction layer 220 include a valve action metal (valve metal), namely, at least one element selected from the group consisting of Al, Ti, Zn, Zr, W, Nb, Mg, Bi, Si, Hf and Ta and be layered on the semiconductor-layer exposed surface 140c in such a manner that a side of the second junction layer 220 being in contact with the semiconductor-layer exposed surface 140c includes at least any one of an oxide and a nitride of these elements. Thereby, the bonding strength between the n-contact layer 140a and the second bonding pad electrode 230 can be more improved as compared with a case where the second junction layer 220 is formed of a valve action metal itself.

Additionally, it is more preferable that the second junction layer 220 be formed of a nitride of at least one element selected from the group consisting of Ta, W and Ti. In particular, using a nitride of a metal, such as Ta, W and Ti, can significantly enhance the bonding strength of the second bonding pad electrode 230 to the n-contact layer 140a.

However, all of the second junction layer 220, that is, the whole second junction layer 220 need not be formed of a nitride of a valve action metal, and it is only necessary that at least the side of the second junction layer 220 being in contact with the n-contact layer 140a is formed of a nitride of a valve action metal. Accordingly, the second junction layer 220 may be formed of a valve action metal nitride layer formed on the side of the n-contact layer 140a and a valve action metal layer formed on the side of the second bonding pad electrode 230. Additionally, the second junction layer 220 may be layered with a layer of a known material for a transparent electrode being interposed on the side of the n-contact layer 140a. In this case, the layer of a known material for a transparent electrode has a function of a junction layer joining with the side of the n-contact layer 140a.

In this case, the second junction layer 220 is preferably a thin film having a thickness in a range of not less than 10 angstroms nor more than 2000 angstroms, and more preferably in a range of not less than 20 angstroms nor more than 1000 angstroms. Note that it is not preferable for the thickness to be less than 10 angstroms, because the strength of the second junction layer 220 decreases and this may lead to decrease in the bonding strength of the second bonding pad electrode 230 to the n-contact layer 140a.

Additionally, it is more preferable that the second junction layer 220 be formed of an oxide of at least one element selected from the group consisting of Ta, Nb and Ti. In particular, using an oxide of a metal, such as Ta, Nb and Ti, can significantly enhance the bonding strength of the second bonding pad electrode 230 to the n-contact layer 140a.

However, all of the second junction layer 220, that is, the whole second junction layer 220 need not be formed of an oxide of a valve action metal, and it is only necessary that at least the side of the second junction layer 220 being in contact with the n-contact layer 140a is formed of an oxide of a valve action metal. Accordingly, the second junction layer 220 may be formed of a valve action metal oxide layer formed on the side of the n-contact layer 140a and a valve action metal layer formed on the side of the second bonding pad electrode 230. Additionally, the second junction layer 220 may be layered with a layer of a known material for a transparent electrode being interposed on the side of the n-contact layer 140a. In this case, the layer of a known material for a transparent electrode has a function of a junction layer joining with the side of the n-contact layer 140a.

In this case, the second junction layer 220 is preferably a thin film having a thickness in a range of not less than 5 angstroms nor more than 1000 angstroms, and more preferably in a range of not less than 10 angstroms nor more than 400 angstroms. Note that it is not preferable for the thickness to be less than 5 angstroms, because the strength of the second junction layer 220 decreases and this may lead to decrease in the bonding strength of the second bonding pad electrode 230 to the n-contact layer 140a.

<Second Bonding Pad Electrode>

As shown in FIG. 1, the second bonding pad electrode 230, which is an example of a second connection electrode, is formed of a laminate in which a second barrier layer 230a and a second bonding layer 230b are layered in the order from the side of the n-contact layer 140a (see FIG. 3).

Note that the second bonding pad electrode 230 may have a single-layer structure formed of only the second barrier layer 230a, or have a three-layer structure in which another barrier layer enhancing strength of the whole second bonding pad electrode 230 is interposed between the second barrier layer 230a and the second bonding layer 230b. Alternatively, the second bonding pad electrode 230 may have a two-layer structure with a barrier layer interposed instead of the second barrier layer 230a.

<Second Barrier Layer>

The second barrier layer 230a shown in FIG. 1 has a function of enhancing the strength of the whole second bonding pad electrode 230 as with the first barrier layer 200a. For this reason, it is preferable to use a relatively firm metal material, and the second barrier layer 230a may be selected from those formed of, for example, any one of Ag, Al, Ru, Rh, Pd, Os, Ir, Pt, Ti, W, Mo, Ni, Co, Zr, Hf, Ta and Nb or an alloy including any one of these metals. Note that, in the present exemplary embodiment, the second barrier layer 230a is more preferably formed of: a platinum metal, such as Ru, Rh, Pd, Os, Ir and Pt;

Al, Ag or Ti; or an alloy including at least one of these metals, as with the first barrier layer 200a.

Additionally, it is preferable for the second barrier layer 230a to be in close contact with the second junction layer 220 in that the bonding strength with the second bonding pad electrode 230 can be enhanced. In order for the second bonding pad electrode 230 to obtain enough strength, the second barrier layer 230a need to be firmly joined with the n-contact layer 140a through the second junction layer 220. At the minimum, it is preferable to have strength enough not to peel off in the step for connecting a gold wire to the bonding pad by a typical method. In particular, any one of Rh, Pd, Ir and Pt or an alloy including at least one of these metals is preferably used for the second barrier layer 230a.

<Second Bonding Layer>

The second bonding layer 230b shown in FIG. 1 is preferably formed of any one of Au and Al or an alloy including at least one of these metals, as with the first bonding layer 200b. Since Au and Al are metals having favorable adhesion to a gold ball that is often used as a bonding ball, using any one of Au and Al or an alloy including at least one of these metals allows the second bonding layer 230b to be excellent in adhesion to a bonding wire. Among these metals, Au is particularly desirable.

The thickness of the second bonding layer 230b is preferably in a range of not less than 500 angstroms nor more than 20000 angstroms, and is further desirably not less than 5000 angstroms nor more than 15000 angstroms.

Making the second bonding layer 230b too thin leads to unfavorable adhesion to a bonding ball, while making the second bonding layer 230b too thick gives no advantage and only leads to an increase in cost.

The second junction layer 220 and the second bonding pad electrode 230 layered thereon may be formed anywhere as long as they are on the semiconductor-layer exposed surface 140c of the n-contact layer 140a. However, from the viewpoint of easiness of bonding operations, the second bonding pad electrode 230 preferably has a size of the order slightly larger than the diameter of the bonding ball, and is typically a circle having a diameter of about 100 μm.

As will be described later, in the present exemplary embodiment, the first junction layer 190 and the second junction layer 220 are formed in the same process, while the first bonding pad electrode 200 and the second bonding pad electrode 230 are formed in the same process. For this reason, the first junction layer 190 and the second junction layer 220 have the same configuration, while the first bonding pad electrode 200 and the second bonding pad electrode 230 have the same configuration.

(Manufacturing Method of Semiconductor Light Emission Element)

Next, a description is given of an example of a manufacturing method of the semiconductor light emission element 1 shown in FIG. 1.

The manufacturing method of the semiconductor light emission element 1 according to the present exemplary embodiment includes: a step for forming the multi-layered semiconductor layers 100 including the light emission layer 150 on the substrate 110; a step for forming the semiconductor-layer exposed surface 140c by cutting out a part of the multi-layered semiconductor layers 100; and a electrode formation step for forming the first electrode 210 on the top surface 160c of the multi-layered semiconductor layers 100 and forming the second electrode 240 on the semiconductor-layer exposed surface 140c.

The step for forming the multi-layered semiconductor layers 100 including the light emission layer 150 includes: an intermediate layer formation step for forming the intermediate layer 120; a base layer formation step for forming the base layer 130; an n-type semiconductor layer formation step for forming the n-type semiconductor layer 140; a light emission layer formation step for forming the light emission layer 150; and a p-type semiconductor layer formation step for forming the p-type semiconductor layer 160. Additionally, the electrode formation step includes: a transparent electrode formation step for forming the transparent electrode 170 on the top surface 160c of the multi-layered semiconductor layers 100; a junction layer formation step for forming the first junction layer 190 on the transparent electrode 170 and forming the second junction layer 220 on the semiconductor-layer exposed surface 140c; a barrier layer formation step for forming the first barrier layer 200a on the first junction layer 190 and forming the second barrier layer 230a on the second junction layer 220; and a bonding layer formation step for forming the first bonding layer 200b on the first barrier layer 200a and forming the second bonding layer 230b on the second barrier layer 230a.

Furthermore, the manufacturing method of the semiconductor light emission element 1 to which the present exemplary embodiment is applied may further include an annealing step in which the obtained semiconductor light emission element is subjected to heat treatment after the electrode formation step, as necessary.

Hereinafter, each of the steps will be sequentially described.

<Multi-Layered Semiconductor Layer Formation Step>

The multi-layered semiconductor layer formation step includes the intermediate layer formation step, the base layer formation step, the n-type semiconductor layer formation step, the light emission layer formation step, and the p-type semiconductor layer formation step.

<Intermediate Layer Formation Step>

First, a substrate 110 such as a sapphire substrate is prepared and subjected to preprocessing. For example, preprocessing may be performed by a method in which the substrate 110 is arranged in a chamber of a sputtering apparatus and sputtered before the intermediate layer 120 is formed. Specifically, preprocessing may be performed in which the substrate 110 is exposed in plasma of Ar and $N_2$ in the chamber, to thereby clean the top surface thereof. Subjecting the substrate 110 to plasma of an Ar gas, an $N_2$ gas and the like allows for removing organic substances and oxides adhering to the top surface of the substrate 110.

Next, the intermediate layer 120 is layered on the top surface of the substrate 110 by the sputtering method.

When the intermediate layer 120 having a single-crystal structure is formed by the sputtering method, it is desirable to set the ratio of the nitrogen flow rate to the flow rate of the nitrogen material and the inert gas in the chamber so that the nitrogen material is from 50% to 100%, desirably 75%.

Meanwhile, when the intermediate layer 120 having a columnar crystal (polycrystal) is formed by the sputtering method, it is desirable to set the ratio of the nitrogen flow rate to the flow rate of the nitrogen material and the inert gas in the chamber so that the nitrogen material is from 1% to 50%, desirably 25%. The intermediate layer 120 may be formed not only by the above-mentioned sputtering method but also by the MOCVD method.

<Base Layer Formation Step>

Next, after the intermediate layer 120 is formed, the single-crystal base layer 130 is formed on the top surface of the substrate 110 on which the intermediate layer 120 is formed. The base layer 130 may be formed by either the sputtering method or the MOCVD method.

<N-Type Semiconductor Layer Formation Step>

After the base layer 130 is formed, the n-type semiconductor layer 140 is formed by layering the n-contact layer 140a and the n-clad layer 140b. The n-contact layer 140a and the n-clad layer 140b may be formed by either the sputtering method or the MOCVD method.

<Light Emission Layer Formation Step>

The light emission layer 150 may be formed by either the sputtering method or the MOCVD method; however, the MOCVD method is particularly preferable. Specifically, the barrier layers 150a and the well layers 150b may be alternately and repeatedly layered in such an order that the barrier layers 150a are arranged on the n-type semiconductor layer 140 side and the p-type semiconductor layer 160 side.

<P-Type Semiconductor Layer Formation Step>

The p-type semiconductor layer 160 may be formed by either the sputtering method or the MOCVD method. Specifically, the p-clad layer 160a and the p-contact layer 160b may be sequentially layered.

<Semiconductor-Layer Exposed Surface Formation Step>

Before the transparent electrode 170 is formed, patterning is performed by a known photolithography technique, and a predetermined region of a part of the multi-layered semiconductor layers 100 is etched to expose a part of the n-contact layer 140a, to thereby form the semiconductor-layer exposed surface 140c.

<Electrode Formation Step>

The electrode formation step includes the transparent electrode formation step, the junction layer formation step, the barrier layer formation step, and the bonding layer formation step.

<Transparent Electrode Formation Step>

The semiconductor-layer exposed surface 140c is covered with a mask, and the transparent electrode 170 is formed by using a known method, such as the sputtering method, on the p-type semiconductor layer 160 that is left without being removed by etching.

Note that the semiconductor-layer exposed surface 140c may be formed by etching a part of a predetermined region of the transparent electrode 170 and the multi-layered semiconductor layers 100 in the state where the transparent electrode 170 is formed in advance on the p-type semiconductor layer 160.

Then, after the protective layer 180 made of $SiO_2$ is formed on the top surfaces of the transparent electrode 170 and the semiconductor-layer exposed surface 140c, unillustrated resist is applied on the protective layer 180.

Then, resist on regions corresponding to portions on which the first bonding pad electrode 200 and the second bonding pad electrode 230 are respectively formed is removed by a known technique, to thereby cause parts of the protective layer 180 respectively formed on the p-type semiconductor layer 160 and the semiconductor-layer exposed surface 140c to be exposed outside.

Then, the protective layer 180 formed of $SiO_2$ is subjected to reactive ion etching (RIE) in the direction orthogonal to the top surface of the transparent electrode 170. The protective layer 180 on the regions corresponding to the portions on which the first bonding pad electrode 200 and the second bonding pad electrode 230 are respectively formed is removed, to thereby expose top surfaces of a part of the transparent electrode 170 and a part of the n-contact layer 140a.

<Junction Layer Formation Step>

Next, by the sputtering method, the first junction layer 190 is formed on the exposed surface of the transparent electrode 170, while the second junction layer 220 is formed on the exposed surface of the semiconductor-layer exposed surface 140c.

First, a description is given of a case where layers of a nitride of a valve metal are formed in the junction layer formation step.

In this case, in the junction layer formation step, films are formed so that layers of a nitride of a valve metal are in contact with the transparent electrode 170 and the semiconductor-layer exposed surface 140c. Here, a method in which a metal target made of a valve metal is used to sputter in an atmosphere including nitrogen is given as an example of a technique to form the nitride films of a valve metal by using the sputtering method. The atmosphere of sputtering preferably includes nitrogen of not less than 3.0 vol % nor more than 50 vol %, more preferably not less than 5.0 vol % nor more than 15 vol %, with respect to the inert gas. At this time, if the transparent electrode 170 side of the first junction layer 190 and the semiconductor-layer exposed surface 140c side of the second junction layer 220 are made to be a valve metal nitride layer and the first barrier layer 200a side of the first junction layer 190 and the second barrier layer 230a side of the second junction layer 220 are made to be a valve metal layer, for example, it is sufficient that the nitrogen concentration in the early stage of the junction layer formation step is raised and that the nitrogen concentration in the final stage of the junction layer formation step is made to be lower than that in the early stage or the supply of nitrogen is stopped. Meanwhile, a method in which a metal nitride target made of a valve metal nitride is used to sputter in an atmosphere including nitrogen or an atmosphere including no nitrogen is given as another example of a technique to form the nitride films of a valve metal. At this time, using the sputtering method with sputtering conditions being controlled makes it possible to form the first junction layer 190 and the second junction layer 220 with a high coverage property regardless of the sputtering material. Note that, at this time, the same material as those of the first junction layer 190 and the second junction layer 220 is layered also on a cured portion of the resist remaining on the transparent electrode 170 and the semiconductor-layer exposed surface 140c.

Next, a description is given of a case where layers of an oxide of a valve metal are formed in the junction layer formation step.

In this case, in the junction layer formation step, films are formed so that layers of an oxide of a valve metal are in contact with the transparent electrode 170 and the semiconductor-layer exposed surface 140c. Here, a method in which a metal target made of a valve metal is used to sputter in an atmosphere including oxygen is given as an example of a technique to form the oxide films of a valve metal by using the sputtering method. The atmosphere of sputtering preferably includes oxygen of not less than 0.1 vol % nor more than 15 vol %, more preferably not less than 1.0 vol % nor more than 10 vol %, with respect to argon. At this time, if the transparent electrode 170 side of the first junction layer 190 and the semiconductor-layer exposed surface 140c side of the second junction layer 220 are made to be a valve metal oxide layer and the first barrier layer 200a side of the first junction layer 190 and the second barrier layer 230a side of the second junction layer 220 are made to be a valve metal layer, for example, it is sufficient that the oxygen concentration in the early stage of the junction layer formation step is raised and that the oxygen concentration in the final stage of the junction layer formation step is made to be lower than that in the early stage or the supply of oxygen is stopped. Meanwhile, a method in which a metal oxide target made of a valve metal oxide is used to sputter in an atmosphere including oxygen or an atmosphere including no oxygen is given as another example of a technique to form the oxide films of a valve metal. At this time, using the sputtering method with sputtering conditions being controlled makes it possible to form the first junction layer 190 and the second junction layer 220 with a high coverage property regardless of the sputtering material. Note that, at this time, the same material as those of the first junction layer 190 and the second junction layer 220 is layered also on a cured portion of the resist remaining on the transparent electrode 170 and the semiconductor-layer exposed surface 140*c*.

<Barrier Layer Formation Step>

Subsequently, by the sputtering method, the first barrier layer 200*a* is formed on the first junction layer 190, while the second barrier layer 230*a* is formed on the second junction layer 220. At this time, using the sputtering method with sputtering conditions being controlled makes it possible to form the first barrier layer 200*a* and the second barrier layer 230*a* with a high coverage property regardless of the sputtering material. Note that, at this time, the same material as those of the first barrier layer 200*a* and the second barrier layer 230*a* is layered also on the side of the cured portion of the resist remaining on the transparent electrode 170 and the semiconductor-layer exposed surface 140*c*.

<Bonding Layer Formation Step>

Furthermore, by the sputtering method, the first bonding layer 200*b* is formed on the first barrier layer 200*a*, while the second bonding layer 230*b* is formed on the second barrier layer 230*a*. At this time, using the sputtering method with sputtering conditions being controlled makes it possible to form the first bonding layer 200*b* and the second bonding layer 230*b* with a high coverage property regardless of the sputtering material. Note that, at this time, the same material as those of the first bonding layer 200*b* and the second bonding layer 230*b* is layered also on the side of the cured portion of the resist remaining on the transparent electrode 170 and the semiconductor-layer exposed surface 140*c*.

Finally, the cured portion of the resist is peeled by immersion in resist peeling solution. Thereby, the first junction layer 190 and the first bonding pad electrode 200 that has the first barrier layer 200*a* and the first bonding layer 200*b* are formed on the transparent electrode 170. Meanwhile, the second junction layer 220 and the second bonding pad electrode 230 that has the second barrier layer 230*a* and the second bonding layer 230*b* are formed on the n-contact layer 140*a*.

<Annealing Step>

Then, the semiconductor light emission element 1 obtained in this manner is subjected to annealing in a reduction atmosphere, such as nitrogen, for example, at not less than 150 degrees C. nor more than 600 degrees C., and more preferably at not less than 200 degrees C. nor more than to 500 degrees C. This annealing step is performed in order to enhance adhesion between the transparent electrode 170 and the first bonding pad electrode 200 with the first junction layer 190 interposed therebetween, and adhesion between the semiconductor-layer exposed surface 140*c* and the second bonding pad electrode 230 with the second junction layer 220 interposed therebetween. Note that implementation of the annealing is not necessary, but is more preferable in order to enhance the adhesion.

Thus, in the above-described manufacturing method of the semiconductor light emission element 1, an example has been described in which nitride films of a valve metal are formed in the junction layer formation step on the side of the contact surface between the first junction layer 190 and the transparent electrode 170 and on the side of the contact surface between the second junction layer 220 and the semiconductor-layer exposed surface 140*c*; however, the manufacturing method is not limited thereto.

Specifically, for example, a method may be employed in which the transparent electrode 170 is formed on the p-type semiconductor layer 160 in the transparent electrode formation step, the obtained transparent electrode 170 is exposed to nitrogen plasma in nitrogen plasma processing, and then the protective layer 180 is formed on the transparent electrode 170 having been subjected to the nitrogen plasma processing. Note that the semiconductor light emission element 1 can be obtained by implementation of the junction layer formation step, the barrier layer formation step and the bonding layer formation step described above after the protective layer 180 is formed.

Additionally, in the above-described manufacturing method of the semiconductor light emission element 1, an example has been described in which oxide films of a valve metal are formed in the junction layer formation step on the side of the contact surface between the first junction layer 190 and the transparent electrode 170 and on the side of the contact surface between the second junction layer 220 and the semiconductor-layer exposed surface 140*c*; however, the manufacturing method is not limited thereto.

Specifically, for example, a method may be employed in which the transparent electrode 170 is formed on the p-type semiconductor layer 160 in the transparent electrode formation step, the obtained transparent electrode 170 is exposed to oxygen plasma in oxygen plasma processing, and then the protective layer 180 is formed on the transparent electrode 170 having been subjected to the oxygen plasma processing. Note that the semiconductor light emission element 1 can be obtained by implementation of the junction layer formation step, the barrier layer formation step and the bonding layer formation step described above after the protective layer 180 is formed.

If the transparent electrode 170 is subjected to the oxygen plasma processing in this manner, more oxygen is taken into the transparent electrode 170 as compared with a case of no oxygen plasma processing. Such excessive oxygen is taken into the first junction layer 190 when the transparent electrode 170 is heated in the subsequent junction layer formation step, barrier layer formation step and bonding layer formation step, to oxidize the valve metal on the transparent electrode 170 side in the first junction layer 190. Since the oxygen moving from the transparent electrode 170 to the first junction layer 190 is basically excessive oxygen in the transparent electrode 170, the characteristics of the transparent electrode 170 hardly change. Accordingly, the same result is obtained as in the case where an oxide film of a valve metal is formed on the side of the transparent electrode 170 in the junction layer formation step.

In the present exemplary embodiment, the transparent electrode 170 and the first bonding pad electrode 200 are connected through the first junction layer 190 including at least any one of a nitride and an oxide of a valve metal, and thus the adhesion and the connection strength of the first bonding pad electrode 200 to the transparent electrode 170 can be improved.

Also, in the present exemplary embodiment, the n-contact layer 140*a* of the n-type semiconductor layer 140 and the second bonding pad electrode 230 are connected through the second junction layer 220 including at least any one of a nitride and an oxide of a valve metal, and thus the adhesion and the connection strength between the n-contact layer 140*a* and the second bonding pad electrode 230 can be enhanced.

Additionally, in the present exemplary embodiment, the first junction layer 190 and the second junction layer 220 are formed so as to include at least any one of a nitride and an oxide of the same valve metal. This makes it possible to make the first junction layer 190 and the second junction layer 220 at the same time and to improve productivity of the semiconductor light emission element 1.

Furthermore, in the present exemplary embodiment, the first bonding pad electrode 200 formed on the first junction layer 190 and the second bonding pad electrode 230 formed on the second junction layer 220 are made to have the same configuration. This makes it possible to make the first bonding pad electrode 200 and the second bonding pad electrode 230 at the same time and to improve productivity of the semiconductor light emission element 1.

EXAMPLES

Next, a description is given of examples of the present invention. However, the present invention is not limited to the examples.

First Example

The present inventors manufactured the semiconductor light emission elements 1 shown in FIG. 1 in combination with various manufacturing conditions, and examined adhesion between the transparent electrode 170 and the first bonding pad electrode 200 in the first electrode 210, on the basis of a known tape peeling test (tape test). Note that the adhesion between the transparent electrode 170 and the first bonding pad electrode 200 is strongly affected by adhesion between the transparent electrode 170 and the first junction layer 190 and adhesion between the first junction layer 190 and the first barrier layer 200a in the first bonding pad electrode 200.

FIG. 4 shows a relationship between various manufacturing conditions in Examples 1 to 15 and Comparative Examples 1 to 6 and respective evaluation results.

As the manufacturing conditions, FIG. 4 shows: the target material of sputtering (metal of the junction layer) and whether or not oxygen is introduced into the atmosphere of sputtering, in the junction layer formation step; whether or not the transparent electrode 170 is subjected to the oxygen plasma processing; and whether or not the annealing step, namely, annealing is performed. Note that herein, an IZO film was used for the transparent electrode 170.

Additionally, as evaluation items, FIG. 4 shows adhesion between the transparent electrode 170 and the first bonding pad electrode 200 in the first electrode 210 with 4 ranks of A to D. The evaluations "A," "B," "C" and "D" indicate "good," "slightly good," "slightly poor" and "poor," respectively.

In Examples 1 to 5 and Comparative Examples 1 and 2, a Ta target was used as the target material of sputtering to form the first junction layer 190. Meanwhile, in Examples 6 to 10 and Comparative Examples 3 and 4, an Nb target was used as the target material of sputtering to form the first junction layer 190. Furthermore, in Examples 11 to 15 and Comparative Examples 5 and 6, a Ti target was used as the target material of sputtering to form the first junction layer 190.

Note that the first barrier layer 200a and the first bonding layer 200b were made of Pt and Au, respectively, in Examples 1 to 15 and Comparative Examples 1 to 6.

Next, the evaluation results are described.

In all of Examples 1 to 15, the evaluations of adhesion are A or B. That is, it is confirmed that the adhesion between the transparent electrode 170 and the first bonding pad electrode 200 is improved by introduction of oxygen into the atmosphere of sputtering in the junction layer formation step or by implementation of the oxygen plasma processing after the transparent electrode 170 is formed. In particular, the evaluations of adhesion are A in Examples 3, 8 and 13 where annealing is performed after the first junction layer 190 is formed by sputtering in an oxygen atmosphere and in Examples 5, 10 and 15 where the oxygen plasma processing on the transparent electrode 170 is further performed in addition to the above processing.

On the other hand, in all of Comparative Examples 1 to 6, the evaluations of adhesion are C or D. That is, it is confirmed that the adhesion between the transparent electrode 170 and the first bonding pad electrode 200 is reduced if oxygen is not introduced into the atmosphere of sputtering in the junction layer formation step and if the oxygen plasma processing is not performed after the formation of the transparent electrode 170. Note that Comparative Examples 2, 4 and 6 involving annealing are seen to have better improvement in adhesion than Comparative Examples 1, 3 and 5 involving no annealing; however, this improvement is not enough to reach a favorable level.

Figure 5:
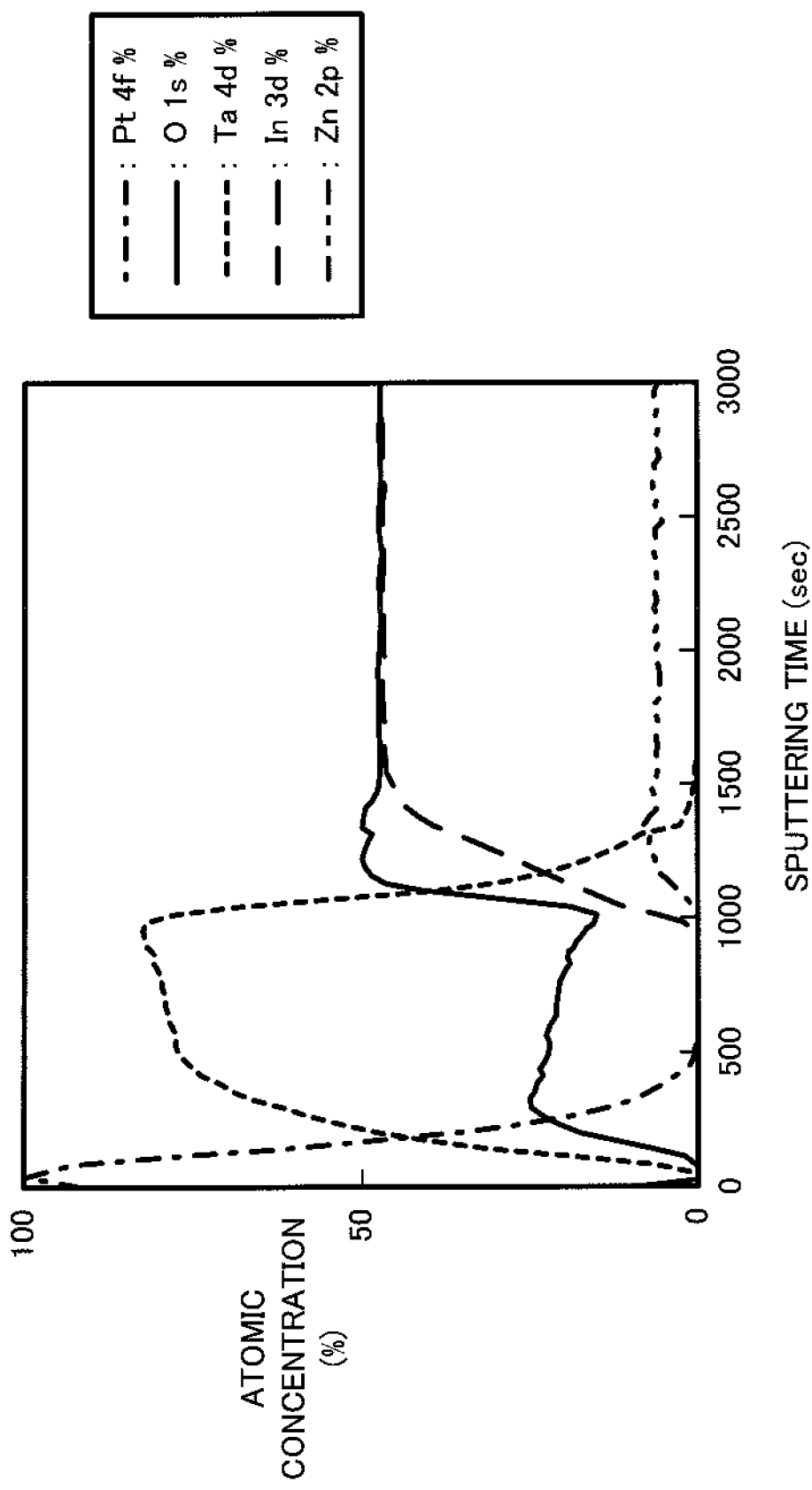
FIG. 5 is a graph showing an analytical result of the first electrode in the semiconductor light emission element of Example 5 being subjected to depth analysis of X-ray photoelectron spectroscopy (XPS)

FIG. 5 shows an analytical result of the first electrode 210 in the semiconductor light emission element 1 of Example 5 being subjected to depth analysis of X-ray photoelectron spectroscopy (XPS). Here, a test sample obtained by layering the first junction layer 190 on the transparent electrode 170 and layering the first barrier layer 200a on the first junction layer 190 was used for the analysis.

In FIG. 5, the lateral axis indicates sputtering time in which an Ar gas is used, while the longitudinal axis indicates atomic concentrations of the respective elements. Note that the sputtering time corresponds to the position of the first electrode 210 in the depth direction.

It is seen from FIG. 5 that in the range where the sputtering time is 0 to 200 sec, that is, at the uppermost side of the layered transparent electrode 170, first junction layer 190 and first barrier layer 200a, much Pt forming the first barrier layer 200a exists in the film.

In the range where the sputtering time is 200 to 1200 sec, it is also seen that Ta and O forming the first junction layer 190 exist, that is, much Ta exists in the oxidized state.

Next, in the range where the sputtering time is 1200 to 3000 sec, it is seen that In, Zn and O exist and that Zn has a lower concentration than In, that is, they exist in the state of IZO.

That is, it is understood that formation of the first junction layer 190 by using the technique described in the present exemplary embodiment allows for film formation of an oxide of a valve metal (herein, Ta).

Figure 6:
FIG. 6 is a transmission electron microscope (TEM) micrograph of a cross section of the first electrode in the semiconductor light emission element of Example 4.

FIG. 6 shows a transmission electron microscope (TEM) micrograph of a cross section of the first electrode 210 in the semiconductor light emission element 1 of Example 4. Here, FIG. 6 shows only the transparent electrode 170, the first junction layer 190 and the first barrier layer 200a of the first electrode 210, except the first bonding layer 200b. Note that for picture taking, the incident direction of electron beams is made to be GaN[10$\bar{1}$0].

It is seen from FIG. 6 that the first junction layer 190 is formed in which a Ta oxide layer exists on the IZO side, namely, on the transparent electrode 170 side and a Ta metal layer exists on the Pt side, namely, on the first barrier layer 200a side between the transparent electrode 170 made of IZO and the first barrier layer 200a made of Pt.

Thus, it is understood that formation of the first junction layer 190 by using the technique described in the present exemplary embodiment allows for film formation of an oxide of a valve metal (herein, Ta) on the transparent electrode 170 side and the valve metal on the first barrier layer 200a side.

As shown in FIGS. 5 and 6, the first junction layer 190 is formed of an oxide of a valve metal in the semiconductor light emission element 1 to which the present exemplary embodiment is applied. This first junction layer 190 has electrical conductivity enough to use as an electrode. This may be attributed to the fact that the oxide of the valve metal exists, in a case of Ta, for example, not as $Ta_2O_5$ but as a conductive material of $Ta_2O_{5-x}$ in the first junction layer 190.

Second Example

The present inventors manufactured the semiconductor light emission elements 1 shown in FIG. 1 in combination with various manufacturing conditions, and examined conductive states, namely, ohmic properties between the n-contact layer 140a and the second bonding pad electrode 230. The present inventors also examined adhesion between the n-contact layer 140a and the second bonding pad electrode 230, on the basis of a known tape peeling test (tape test). Note that the adhesion between the n-contact layer 140a and the second bonding pad electrode 230 is strongly affected by adhesion between the n-contact layer 140a and the second junction layer 220 and adhesion between the second junction layer 220 and the second barrier layer 230a in the second bonding pad electrode 230.

FIG. 7 shows a relationship between various manufacturing conditions in Examples 16 to 21 and Comparative Examples 7 to 9 and respective evaluation results.

As the manufacturing conditions, FIG. 7 shows the target material of sputtering (metal of the junction layer), whether or not oxygen is introduced into the atmosphere of sputtering and whether or not nitrogen is introduced into the atmosphere of sputtering, in the junction layer formation step.

Additionally, as evaluation items, FIG. 7 shows ohmic properties between the n-contact layer 140a and the second bonding pad electrode 230 and adhesion between the n-contact layer 140a and the second bonding pad electrode 230, respectively with 3 ranks of A, B and C. The evaluations "A," "B" and "C" indicate "good," "slightly good" and "poor," respectively.

In Examples 16 and 19 and Comparative Example 7, a Ta target was used as the target material of sputtering to form the second junction layer 220. Meanwhile, in Examples 17 and 20 and Comparative Example 8, an Nb target was used as the target material of sputtering to form the second junction layer 220. Furthermore, in Examples 18 and 21 and Comparative Example 9, a Ti target was used as the target material of sputtering to form the second junction layer 220.

Additionally, in Examples 16 to 18, oxygen was introduced into the atmosphere of sputtering, while in Examples 19 to 21, nitrogen was introduced into the atmosphere of sputtering. In contrast, in Comparative Examples 7 to 9, neither oxygen nor nitrogen was introduced into the atmosphere of sputtering, and only Ar was used.

Furthermore, the second barrier layer 230a and the second bonding layer 230b were made of Pt and Au, respectively, in Examples 16 to 21 and Comparative Examples 7 to 9.

Next, the evaluation results are described.

In all of Examples 16 to 21, the evaluations of adhesion are B or better. That is, it is confirmed that the adhesion between the n-contact layer 140a and the second bonding pad electrode 230 is improved by introduction of oxygen or nitrogen into the atmosphere of sputtering in the junction layer formation step. In particular, in addition to the evaluations of adhesion being A, those of ohmic properties are also A, in Examples 17 and 19 where sputtering is performed with Nb as a target under the oxygen atmosphere or with Ta as a target under the nitrogen atmosphere.

On the other hand, in Comparative Examples 7 to 9, the evaluations of adhesion are all C while those of ohmic properties are all A. That is, it is confirmed that the adhesion between the n-contact layer 140a and the second bonding pad electrode 230 is reduced if oxygen or nitrogen is not introduced into the atmosphere of sputtering in the junction layer formation step.

Thus, it is understood that the second junction layer 220 formed of an oxide or a nitride of a valve metal causes the adhesion between the n-contact layer 140a and the second electrode 240 of the semiconductor light emission element 1 to improve.

The second junction layer 220 is formed of an oxide or a nitride of a valve metal in the semiconductor light emission element 1 to which the present exemplary embodiment is applied. This second junction layer 220 has electrical conductivity enough to use as an electrode. This may be attributed to the fact that the oxide of the valve metal exists, in a case of Ta, for example, not as $Ta_2O_5$ but as a conductive material of $Ta_2O_{5-x}$ in the second junction layer 220 or that the nitride of the valve metal exists, in a case of Ta, for example, as a conductive type of $TaN_{1-x}$ in the second junction layer 220.

Third Example

The present inventors manufactured the semiconductor light emission elements 1 shown in FIG. 1 in combination with various manufacturing conditions, and examined adhesion between the transparent electrode 170 and the first bonding pad electrode 200 in the first electrode 210, on the basis of a known tape peeling test (tape test). Note that the adhesion between the transparent electrode 170 and the first bonding pad electrode 200 is strongly affected by adhesion between the transparent electrode 170 and the first junction layer 190 and adhesion between the first junction layer 190 and the first barrier layer 200a in the first bonding pad electrode 200.

FIGS. 8 to 10 show relationships between various manufacturing conditions and evaluation results on adhesion in Examples 22 to 44 and Comparative Examples 10 to 15.

As the manufacturing conditions, FIGS. 8 to 10 show the target material of sputtering in the junction layer formation step, the ratio of nitrogen to argon in the sputtering atmosphere, namely, the $N_2$ concentration (vol %) and the thickness (Å) of the obtained first junction layer 190.

Additionally, as evaluation items, FIGS. 8 to 10 show adhesion between the transparent electrode 170 and the first bonding pad electrode 200 in the first electrode 210 with 3 ranks of A to C. The evaluations "A," "B" and "C" indicate "good," "slightly good" and "poor," respectively.

FIG. 8 shows examples (Examples 22 to 32) and comparative examples (Comparative Examples 10 and 11) in which Ta was used as the target material. FIG. 9 shows examples (Examples 33 to 38) and comparative examples (Comparative Examples 12 and 13) in which W was used as the target material. Additionally, FIG. 10 shows examples (Examples 39 to 44) and comparative examples (Comparative Examples 14 and 15) in which Ti was used as the target material. In these Examples 22 to 44 and Comparative Examples 10 to 15, an IZO film was used for the transparent electrode 170, and the first barrier layer 200a was made of Pt by 1000 angstroms while the first bonding layer 200b was made of Au by 5000 angstroms.

Next, the evaluation results are described.

As shown in FIG. 8, when Ta is used as the target material, the evaluations of adhesion are A or B in Examples 22 to 32. Additionally, in Examples 22, 23, 25 and 30 to 32 where the thickness of the first junction layer 190 is fixed to 100 angstroms, it is found that setting the $N_2$ concentration in the sputtering atmosphere at 20 vol % or more makes the evaluation of adhesion be A. In contrast, in Comparative Examples 10 and 11 where the $N_2$ concentration in the sputtering atmosphere is set at 0 vol % or 1.0 vol %, both the evaluations of adhesion are C.

Meanwhile, in Examples 24 to 29 where the $N_2$ concentration in the sputtering atmosphere is set at 7.5 vol %, fixing the thickness of the first junction layer 190 to 250 angstroms or more makes the evaluations of adhesion be A.

Note that the present inventors attempted to form the first junction layer 190 by sputtering under the condition of the $N_2$ concentration in the sputtering atmosphere being set at more than 50 vol % in the case where Ta was used for the target material; however, this caused the film formation rate to decrease and was not practical from the viewpoint of production.

As shown in FIG. 9, when W is used as the target material, the evaluations of adhesion are A or B in Examples 33 to 38. Additionally, in Examples 33 to 38 where the thickness of the first junction layer 190 is fixed to 100 angstroms, it is found that setting the $N_2$ concentration in the sputtering atmosphere at 10 vol % or more makes the evaluation of adhesion be A. In contrast, in Comparative Examples 12 and 13 where the $N_2$ concentration in the sputtering atmosphere is set at 0 vol % or 1.0 vol %, both the evaluations of adhesion are C.

Note that the present inventors attempted to form the first junction layer 190 by sputtering under the condition of the $N_2$ concentration in the sputtering atmosphere being set at more than 50 vol % in the case where W was used for the target material; however, this caused the film formation rate to decrease and was not practical from the viewpoint of production.

As shown in FIG. 10, when Ti is used as the target material, the evaluations of adhesion are A or B in Examples 39 to 44. Additionally, in Examples 39 to 44 where the thickness of the first junction layer 190 is fixed to 100 angstroms, it is found that setting the $N_2$ concentration in the sputtering atmosphere at 10 vol % or more makes the evaluation of adhesion be A. In contrast, in Comparative Examples 14 and 15 where the $N_2$ concentration in the sputtering atmosphere is set at 0 vol % or 1.0 vol %, both the evaluations of adhesion are C.

Note that the present inventors attempted to form the first junction layer 190 by sputtering under the condition of the $N_2$ concentration in the sputtering atmosphere being set at more than 50 vol % in the case where Ti was used for the target material; however, this caused the film formation rate to decrease and was not practical from the viewpoint of production.

FIGS. 11A to 11F are views for illustrating an example of results of the tape peeling test in the cases where the first junction layers 190 are formed with Ta used as the target material, the thicknesses kept constant, and the $N_2$ concentrations in the sputtering atmosphere made different from each other. Note that herein, each of the objects for use in the tape peeling test is a single wafer-like substrate 110 with the intermediate layer 120, the base layer 130, the n-type semiconductor layer 140, the light emission layer 150, the p-type semiconductor layer 160, the transparent electrode 170, the first junction layer 190 and the first bonding pad electrode 200 (the first barrier layer 200a and the first bonding layer 200b) formed on almost all the surface thereof. The thickness of the first junction layer 190 is set at 100 angstroms, that of the first barrier layer 200a made of Pt is set at 1000 angstroms, and that of the first bonding layer 200b made of Au is set at 5000 angstroms.

Figure 11:
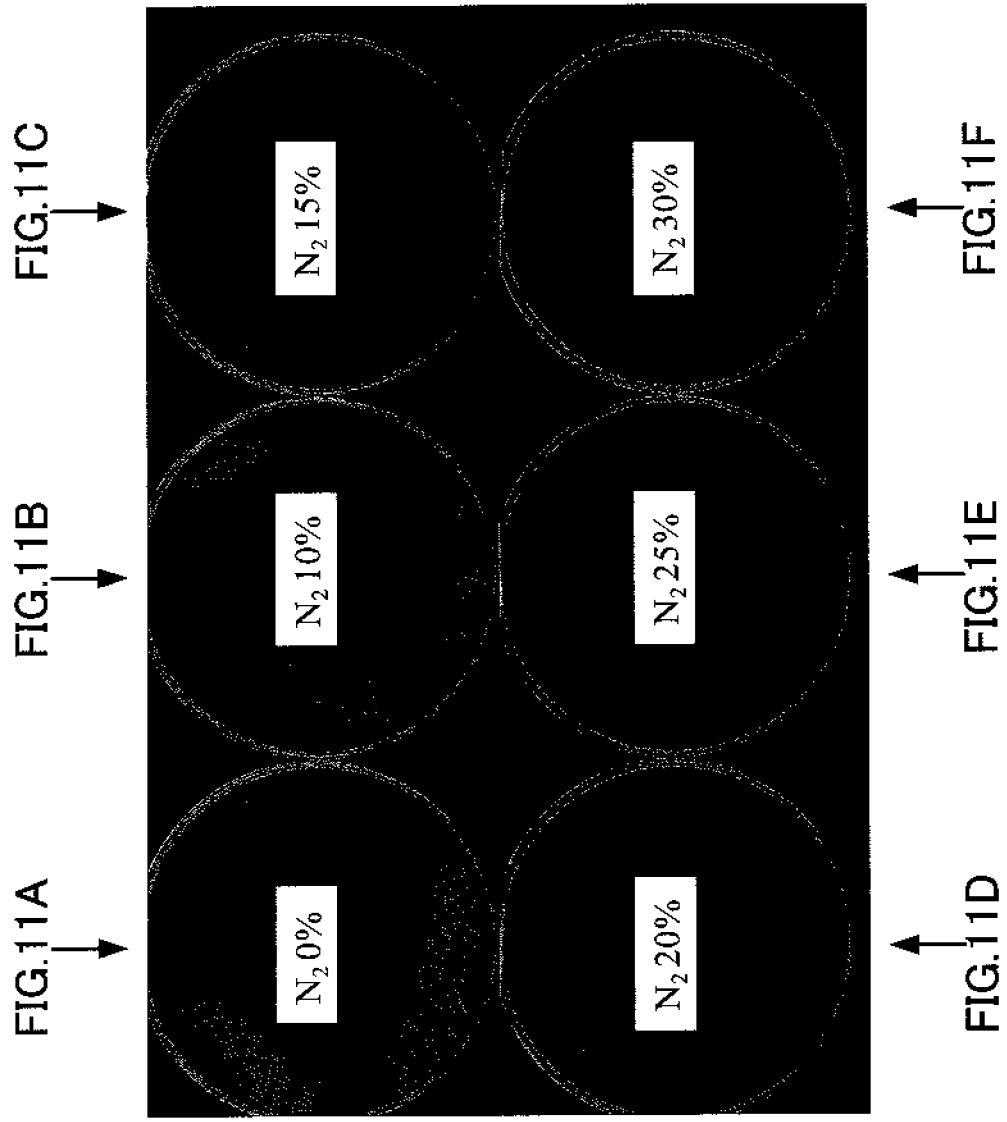
FIGS. 11A to 11F are views for illustrating an example of results of the tape peeling test in the cases where the first junction layers are formed with Ta used as the target material, the thicknesses kept constant, and the $N_2$ concentrations in the sputtering atmosphere made different from each other.

FIG. 11A shows the result of a case (Comparative Example 10) where the $N_2$ concentration in the sputtering atmosphere is set at 0 vol %. FIG. 11B shows the result of a case (Example 30) where the $N_2$ concentration in the sputtering atmosphere is set at 10 vol %. FIG. 11C shows the result of a case (not listed in the examples and the comparative examples) where the $N_2$ concentration in the sputtering atmosphere is set at 15 vol %. FIG. 11D shows the result of a case (Example 31) where the $N_2$ concentration in the sputtering atmosphere is set at 20 vol %. FIG. 11E shows the result of a case (not listed in the examples and the comparative examples) where the $N_2$ concentration in the sputtering atmosphere is set at 25 vol %. FIG. 11F shows the result of a case (not listed in the examples and the comparative examples) where the $N_2$ concentration in the sputtering atmosphere is set at 30 vol %.

It is understood from FIGS. 11A to 11F that increasing the $N_2$ concentration in the sputtering atmosphere makes peeling of films less likely to occur. In particular, it is understood that setting the $N_2$ concentration in the sputtering atmosphere at 15 vol % or more, more preferably at 20 vol % or more, enhances the adhesion between the transparent electrode 170 and the first bonding pad electrode 200 with the first junction layer 190 interposed therebetween, and thus leads to almost no peeling of films.

On the other hand, FIGS. 12A to 12G are views for illustrating an example of results of the tape peeling test in the cases where the first junction layers 190 are formed with Ta used as the target material, the $N_2$ concentrations in the sputtering atmosphere fixed at 7.5 vol % (except FIG. 12A to be described later), and the thicknesses made different from each other. Note that herein, each of the objects for use in the tape peeling test is a single wafer-like substrate 110 with the intermediate layer 120, the base layer 130, the n-type semiconductor layer 140, the light emission layer 150, the p-type semiconductor layer 160, the transparent electrode 170, the first junction layer 190 and the first bonding pad electrode 200 (the first barrier layer 200a and the first bonding layer 200b) formed on almost all the surface thereof, as in the case of the above. The thickness of the first junction layer 190 is set at 20 to 1000 angstroms, that of the first barrier layer 200a made of Pt is set at 1000 angstroms, and that of the first bonding layer 200b made of Au is set at 5000 angstroms.

Figure 12:
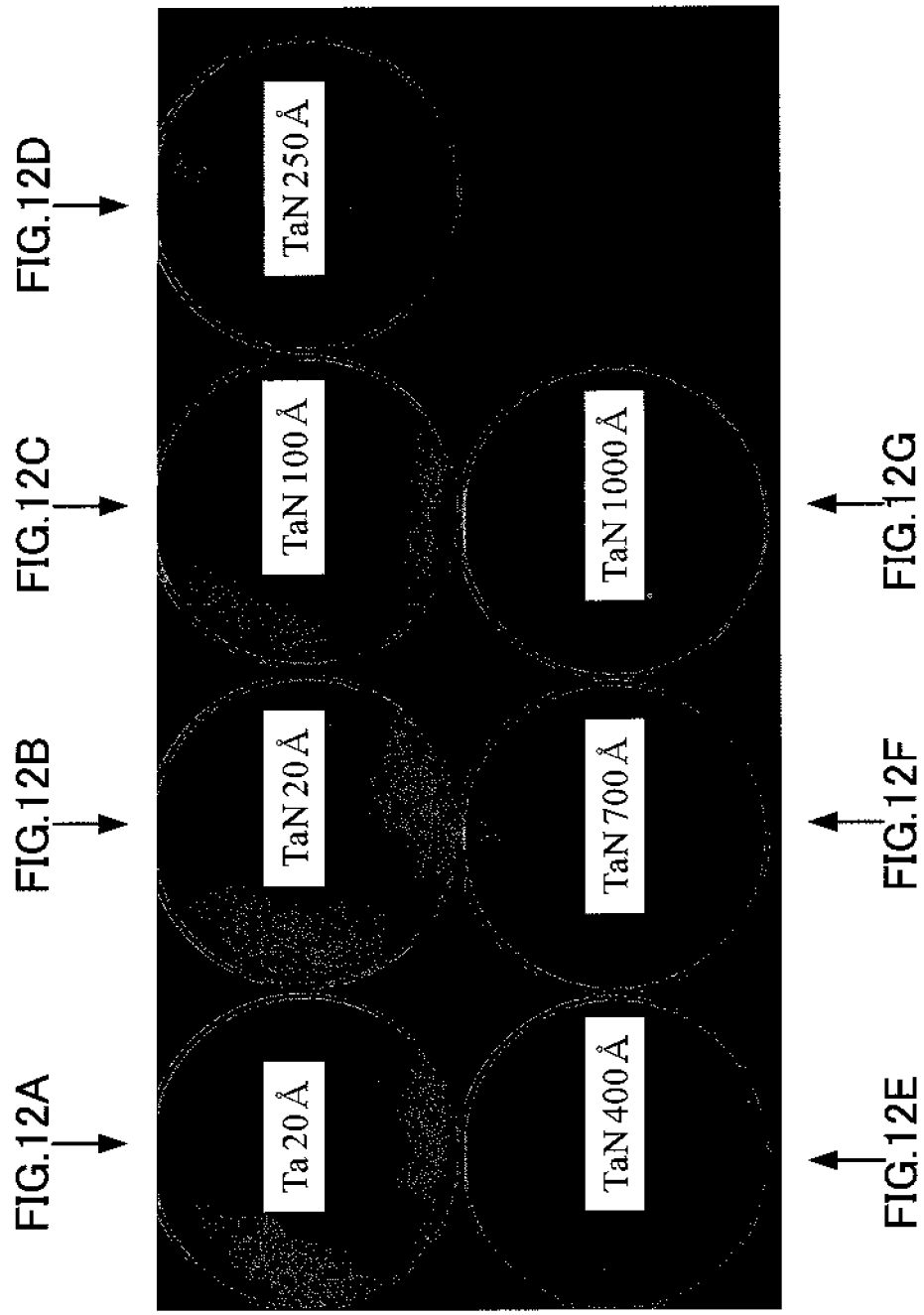
FIGS. 12A to 12G are views for illustrating an example of results of the tape peeling test in the cases where the first junction layers are formed with Ta used as the target material, the $N_2$ concentrations in the sputtering atmosphere fixed at 7.5 vol %, and the thicknesses made different from each other.

FIG. 12A shows the result of a case (not listed in the examples and the comparative examples) where the first junction layer 190 is formed of non-nitrided Ta by setting the $N_2$ concentration in the sputtering atmosphere at 0 vol % while the thickness thereof is set at 20 angstroms. FIG. 12B shows the result of a case (Example 24) where the first junction layer 190 is formed under a nitrogen atmosphere while the thickness thereof is set at 20 angstroms. FIG. 12C shows the result of a case (Example 25) where the first junction layer 190 is formed under a nitrogen atmosphere while the thickness thereof is set at 100 angstroms. FIG. 12D shows the result of a case (Example 26) where the first junction layer 190 is formed under a nitrogen atmosphere while the thickness thereof is set at 250 angstroms. FIG. 12E shows the result of a case (Example 27) where the first junction layer 190 is formed under a nitrogen atmosphere while the thickness thereof is set at 400 angstroms. FIG. 12F shows the result of a case (Example 28) where the first junction layer 190 is formed under a nitrogen atmosphere while the thickness thereof is set at 700 angstroms. FIG. 12G shows the result of a case (Example 29) where the first junction layer 190 is formed under a nitrogen atmosphere while the thickness thereof is set at 1000 angstroms.

It is understood from FIGS. 12A to 12G that introduction of $N_2$ into the sputtering atmosphere makes peeling of films less likely to occur, as compared with a case where no $N_2$ is introduced into the sputtering atmosphere. Additionally, it is understood from FIGS. 12B to 12G that increasing the thickness of the first junction layer 190 formed in a nitrogen atmosphere makes peeling of films less likely to occur. In particular, it is understood that setting the thickness of the first junction layer 190 at 100 angstroms or more, more preferably at 250 angstroms or more, enhances the adhesion between the transparent electrode 170 and the first bonding pad electrode 200 with the first junction layer 190 interposed therebetween, and thus leads to almost no peeling of films.

Figure 13:
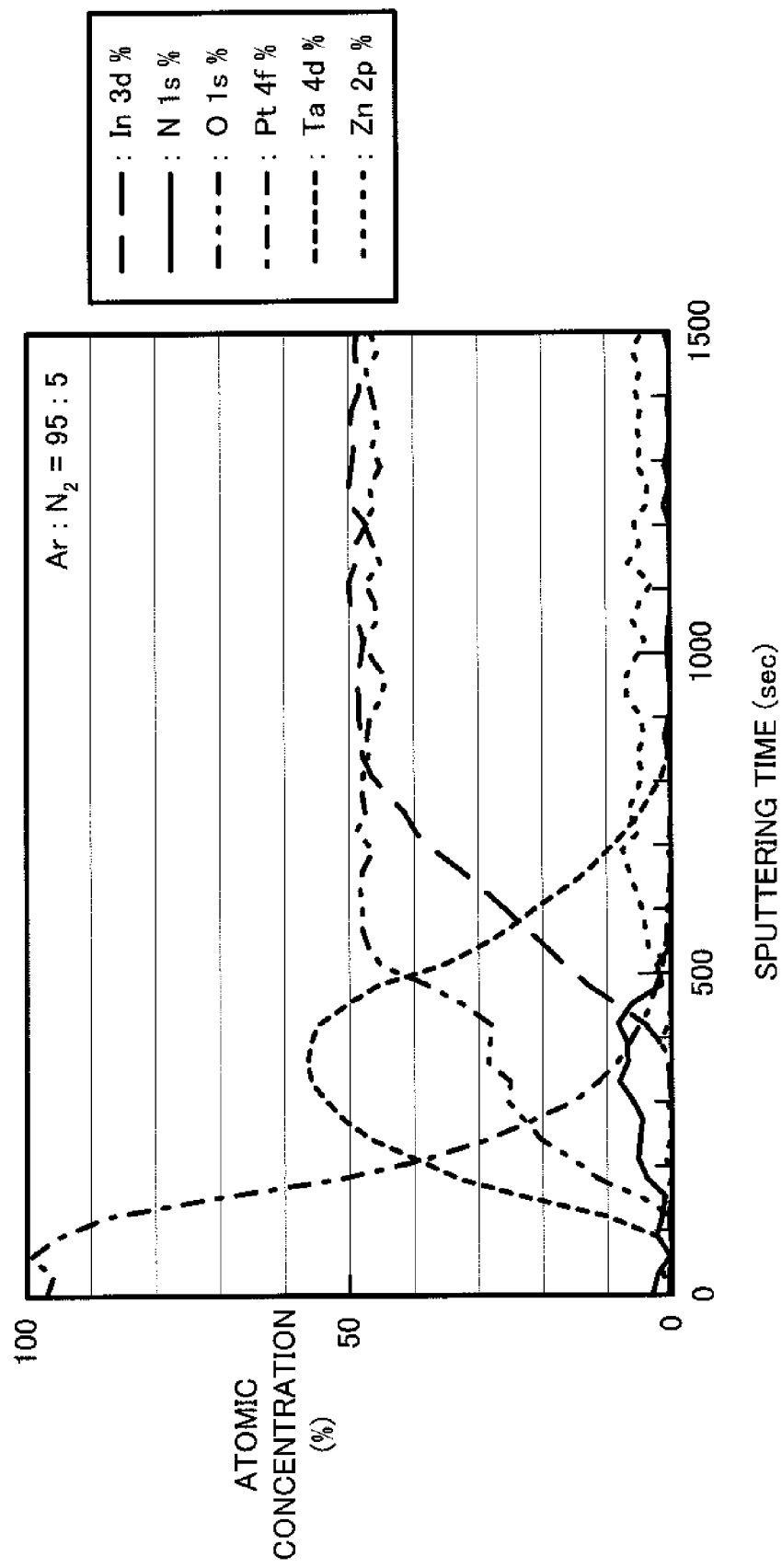
FIG. 13 is a graph showing an analytical result of the first electrode in the semiconductor light emission element corresponding to Example 23 being subjected to depth analysis of X-ray photoelectron spectroscopy.

FIG. 13 shows an analytical result of the first electrode 210 in the semiconductor light emission element 1 corresponding to Example 23 (target material: Ta, and $N_2$ concentration in the sputtering atmosphere: 5.0 vol %) being subjected to depth analysis of X-ray photoelectron spectroscopy (XPS). Here, a test sample obtained by layering the first junction layer 190 on the transparent electrode 170 and layering the first barrier layer 200a on the first junction layer 190 was used for the analysis. Additionally, in this example, the thickness of the first junction layer 190 was set to be not 100 angstroms but 400 angstroms.

In FIG. 13, the lateral axis indicates sputtering time in which an Ar gas is used, while the longitudinal axis indicates atomic concentrations of the respective elements. Note that the sputtering time corresponds to the position of the first electrode 210 in the depth direction.

It is seen from FIG. 13 that in the range where the sputtering time is 0 to 200 sec, that is, at the uppermost side of the layered transparent electrode 170, first junction layer 190 and first barrier layer 200a, much Pt forming the first barrier layer 200a exists in the film.

In the range where the sputtering time is 200 to 600 sec, it is also seen that much Ta and N forming the first junction layer 190 exist, that is, a part of Ta exists in the nitrided state. Note that the level of the concentration of the nitrogen element in the first junction layer 190 is less than 5% at the maximum in this analytical result.

Next, in the range where the sputtering time is 600 to 1500 sec, it is seen that In, Zn and O exist and that Zn has a lower concentration than In, that is, they exist in the state of IZO.

Figure 14:
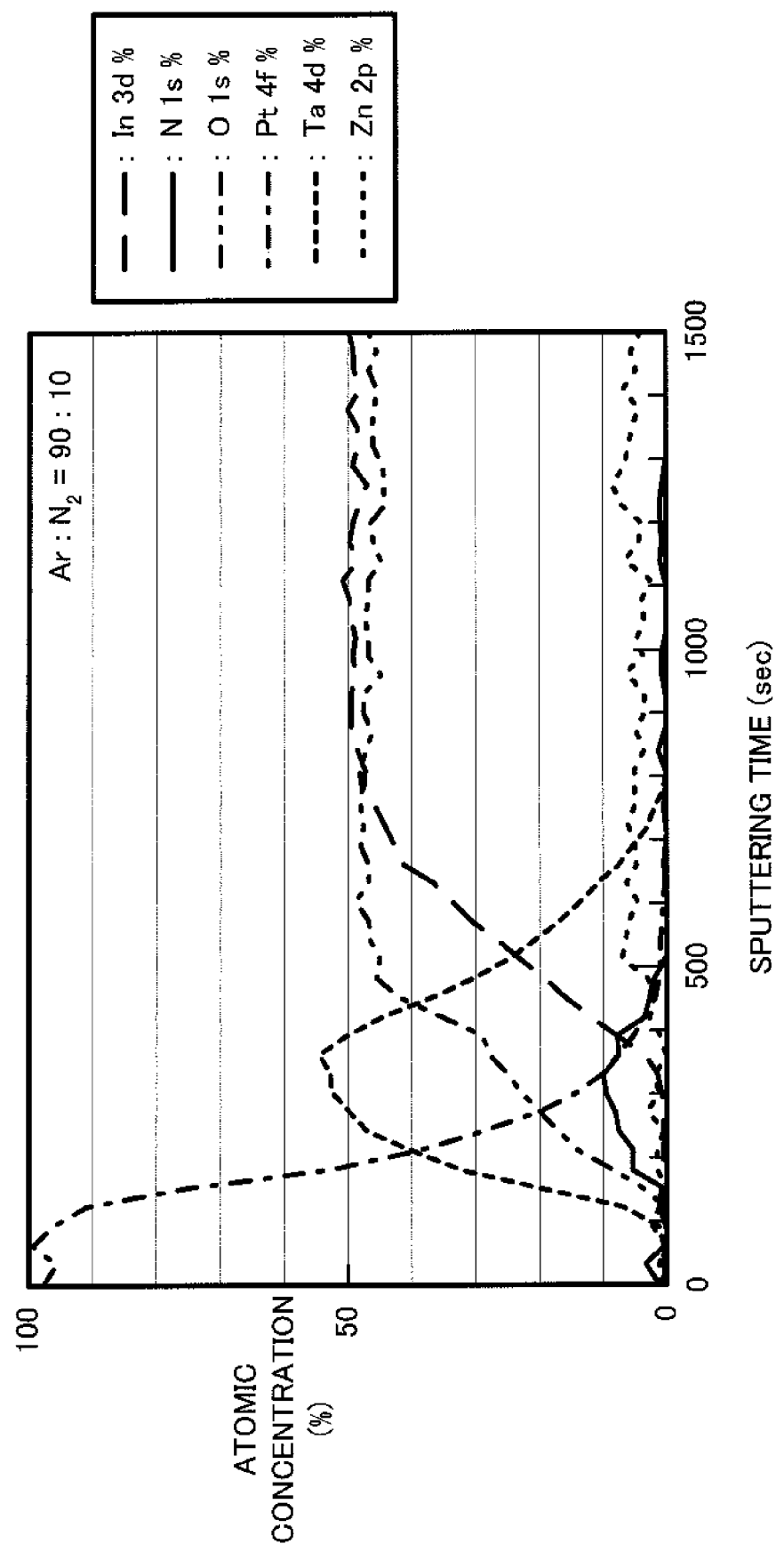
FIG. 14 is a graph showing an analytical result of the first electrode in the semiconductor light emission element corresponding to Example 30 being subjected to depth analysis of X-ray photoelectron spectroscopy.

FIG. 14 shows an analytical result of the first electrode 210 in the semiconductor light emission element 1 corresponding to Example 30 (target material: Ta, and $N_2$ concentration in the sputtering atmosphere: 10 vol %) being subjected to depth analysis of XPS. As in the above-described cases, a test sample obtained by layering the first junction layer 190 on the transparent electrode 170 and layering the first barrier layer 200a on the first junction layer 190 was used for the analysis. Additionally, in this example, the thickness of the first junction layer 190 was set to be not 100 angstroms but 400 angstroms.

Note that the lateral axis and the longitudinal axis in FIG. 14 are the same as those illustrated in FIG. 13.

It is seen from FIG. 14 that in the range where the sputtering time is 0 to 200 sec, that is, at the uppermost side of the layered transparent electrode 170, first junction layer 190 and first barrier layer 200a, much Pt forming the first barrier layer 200a exists in the film.

In the range where the sputtering time is 200 to 600 sec, it is also seen that much Ta and N forming the first junction layer 190 exist, that is, a part of Ta exists in the nitrided state. Note that the level of the concentration of the nitrogen element in the first junction layer 190 exceeds 5% at the maximum in this analytical result.

Next, in the range where the sputtering time is 600 to 1500 sec, it is seen that In, Zn and O exist and that Zn has a lower concentration than In, that is, they exist in the state of IZO.

Figure 15:
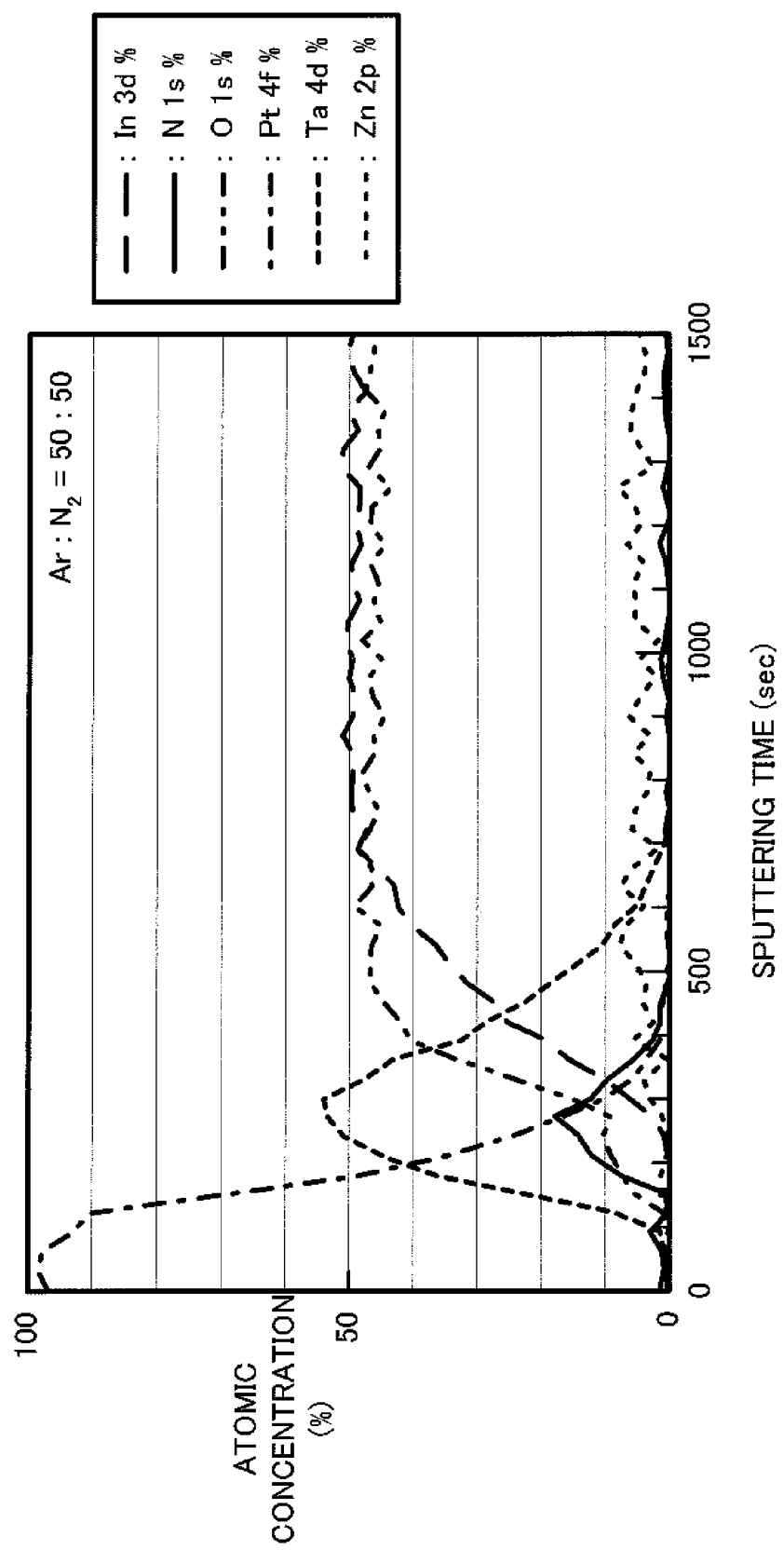
FIG. 15 is a graph showing an analytical result of the first electrode in the semiconductor light emission element corresponding to Example 32 being subjected to depth analysis of X-ray photoelectron spectroscopy.

Additionally, FIG. 15 shows an analytical result of the first electrode 210 in the semiconductor light emission element 1 corresponding to Example 32 (target material: Ta, and $N_2$ concentration in the sputtering atmosphere: 50 vol %) being subjected to depth analysis of XPS. As in the above-described cases, a test sample obtained by layering the first junction layer 190 on the transparent electrode 170 and layering the first barrier layer 200a on the first junction layer 190 was used for the analysis. Additionally, in this example, the thickness of the first junction layer 190 was set to be not 100 angstroms but 400 angstroms.

Note that the lateral axis and the longitudinal axis in FIG. 15 are the same as those illustrated in FIG. 13.

It is seen from FIG. 15 that in the range where the sputtering time is 0 to 200 sec, that is, at the uppermost side of the layered transparent electrode 170, first junction layer 190 and first barrier layer 200a, much Pt forming the first barrier layer 200a exists in the film.

In the range where the sputtering time is 200 to 600 sec, it is also seen that much Ta and N forming the first junction layer 190 exist, that is, a part of Ta exists in the nitrided state. Note that the level of the concentration of the nitrogen element in the first junction layer 190 exceeds 15% at the maximum in this analytical result.

Next, in the range where the sputtering time is 600 to 1500 sec, it is seen that In, Zn and O exist and that Zn has a lower concentration than In, that is, they exist in the state of IZO.

Figure 16:
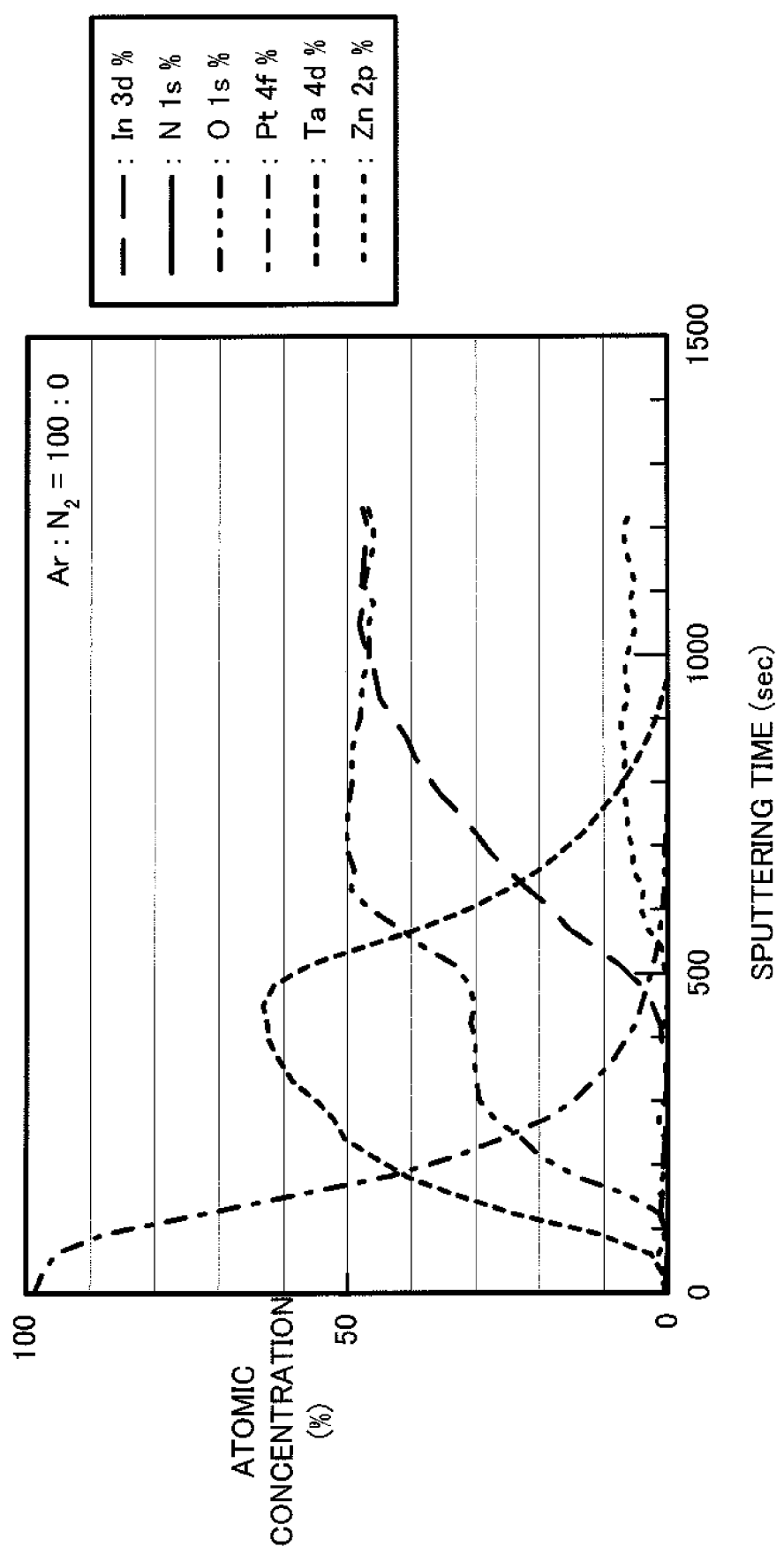
FIG. 16 is a graph showing an analytical result of the first electrode in the semiconductor light emission element corresponding to Comparative Example 10 being subjected to depth analysis of X-ray photoelectron spectroscopy.

On the other hand, FIG. 16 shows an analytical result of the first electrode 210 in the semiconductor light emission element 1 corresponding to Comparative Example 10 (target material: Ta, and $N_2$ concentration in the sputtering atmosphere: 0 vol %) being subjected to depth analysis of XPS. As in the above-described cases, a test sample obtained by layering the first junction layer 190 on the transparent electrode 170 and layering the first barrier layer 200a on the first junction layer 190 was used for the analysis. Additionally, in this example, the thickness of the first junction layer 190 was set to be not 100 angstroms, but 400 angstroms.

Note that the lateral axis and the longitudinal axis in FIG. 16 are the same as those illustrated in FIG. 13.

It is seen from FIG. 16 that in the range where the sputtering time is 0 to 200 sec, that is, at the uppermost side of the layered transparent electrode 170, first junction layer 190 and first barrier layer 200a, much Pt forming the first barrier layer 200a exists in the film.

In the range where the sputtering time is 200 to 600 sec, it is also seen that much Ta forming the first junction layer 190 exists, that is, Ta exists without being nitrided.

Next, in the range where the sputtering time is 600 to 1500 sec, it is seen that In, Zn and O exist and that Zn has a lower concentration than In, that is, they exist in the state of IZO.

Accordingly, as is clear from FIGS. 13 to 16, it is understood that formation of the first junction layer 190 by using the technique described in the present exemplary embodiment, more specifically implementation of sputtering in a nitrogen atmosphere allows for film formation of a nitride of a valve metal (herein, Ta).

Additionally, it is understood from FIGS. 13 to 16 that as the $N_2$ concentration in the sputtering atmosphere on the occasion of forming the first junction layer 190 increases, the peak shapes of Ta and N become sharper, that is, Ta becomes less likely to diffuse toward the transparent electrode 170. If much Ta diffuses toward the transparent electrode 170, the incoming Ta may decompose IZO forming the transparent electrode 170, to cause deposition of In. The deposition of In from the transparent electrode 170 in this manner reduces the adhesion between the transparent electrode 170 and the first junction layer 190, causing the first bonding pad electrode 200 to be likely to peel off.

Accordingly, it is understood that employing a configuration including a nitride of a valve metal as the first junction layer 190 enhances the adhesion between the transparent electrode 170 and the first bonding pad electrode 200 with the first junction layer 190 interposed therebetween, and thus makes the peeling less likely to occur The first junction layer 190 is formed of a nitride of a valve metal in the semiconductor light emission element 1 to which the present exemplary embodiment is applied. This first junction layer 190 has electrical conductivity enough to use as an electrode. This may be attributed to the fact that the nitride of the valve metal exists, in a case of Ta, for example, not as TaN but as $TaN_{1-x}$ in the first junction layer 190, that TaN has a relatively low resistivity value, or that the first junction layer 190 is formed so as to have a mixture of Ta and TaN.

Reference Signs List
1 . . . semiconductor light emission element
100 . . . multi-layered semiconductor layer
110 . . . substrate
120 . . . intermediate layer
130 . . . base layer
140 . . . n-type semiconductor layer
140a . . . n-contact layer
140b . . . n-clad layer
140c . . . semiconductor-layer exposed surface
150 . . . light emission layer
150a . . . barrier layer
150b . . . well layer
160 . . . p-type semiconductor layer
160a . . . p-clad layer
160b . . . p-contact layer
160c . . . top surface
170 . . . transparent electrode
180 . . . protective layer
190 . . . first junction layer
200 . . . first bonding pad electrode
200a . . . first barrier layer
200b . . . first bonding layer
210 . . . first electrode
220 . . . second junction layer
230 . . . second bonding pad electrode
230a . . . second barrier layer
230b . . . second bonding layer
240 . . . second electrode

The invention claimed is:

1. A semiconductor light emission element comprising:
a substrate;
multi-layered semiconductor layers including a light emission layer and layered on the substrate;
a transparent electrode including an indium oxide and layered on the multi-layered semiconductor layers;
a junction layer including at least one element selected from valve action metals, the junction layer being layered on the transparent electrode in such a manner that a side of the junction layer being in contact with the transparent electrode includes at least any one of an oxide and a nitride of the element; and
a connection electrode layered on the junction layer and used for electrical connection with outside.

2. The semiconductor light emission element according to claim 1, wherein the junction layer includes at least one element selected from the group consisting of Al, Ti, Zn, Zr, Nb, W, Mg, Bi, Si, Hf and Ta.

3. The semiconductor light emission element according to claim 2, wherein when the junction layer includes a nitride of the element, the junction layer includes at least one element selected from the group consisting of Ta, W and Ti.

4. The semiconductor light emission element according to claim 2, wherein when the junction layer includes an oxide of the element, the junction layer includes at least one element selected from the group consisting of Ta, Nb and Ti.

5. The semiconductor light emission element according to claim 1, wherein the connection electrode has a bonding layer formed of any one of Au and Al or an alloy including any one of Au and Al.

6. The semiconductor light emission element according to claim 5, wherein
the connection electrode further includes a barrier layer layered between the junction layer and the bonding layer, and
the barrier layer is formed of any one of Ag, Al, Ru, Rh, Pd, Os, Ir, Pt, Ti, W, Mo, Ni, Co, Zr, Hf, Ta and Nb or an alloy including any one of these metals.

7. The semiconductor light emission element according to claim 1, wherein the transparent electrode includes the indium oxide and a zinc oxide.

8. The semiconductor light emission element according to claim 1, wherein the multi-layered semiconductor layers are formed of a group III nitride semiconductor.

9. A semiconductor light emission element comprising:
a substrate;
multi-layered semiconductor layers formed of a group III nitride semiconductor having a light emission layer, the multi-layered semiconductor layers being layered on the substrate;
a junction layer including at least one element selected from valve action metals, the junction layer being layered on one semiconductor layer among the multi-layered semiconductor layers in such a manner that a side of the junction layer being in contact with the one semiconductor layer includes at least any one of an oxide and a nitride of the element; and
a connection electrode layered on the junction layer and used for electrical connection with outside.

10. The semiconductor light emission element according to claim 9, wherein the junction layer includes at least one element selected from the group consisting of Al, Ti, Zn, Zr, Nb, Mg, Bi, Si, Hf and Ta.

11. The semiconductor light emission element according to claim 10, wherein the junction layer includes at least one element selected from the group consisting of Ta, Nb and Ti.

12. The semiconductor light emission element according to claim 9, wherein the connection electrode has a bonding layer formed of any one of Au and Al or an alloy including any one of Au and Al.

13. The semiconductor light emission element according to claim 12, wherein
the connection electrode further includes a barrier layer layered between the junction layer and the bonding layer, and
the barrier layer is formed of any one of Ag, Al, Ru, Rh, Pd, Os, Ir, Pt, Ti, W, Mo, Ni, Co, Zr, Hf, Ta and Nb or an alloy including any one of these metals.

14. A semiconductor light emission element comprising:
a first semiconductor layer having a first conductivity type;
a light emission layer layered on the first semiconductor layer;
a second semiconductor layer layered on the light emission layer and having a second conductivity type opposite to the first conductivity type;
a transparent electrode layered on the second semiconductor layer, the transparent electrode including an indium oxide and having transparency to light outputted from the light emission layer;
a first junction layer including at least one element selected from valve action metals, the first junction layer being layered on the transparent electrode in such a manner that a side of the first junction layer being in contact with the transparent electrode includes at least any one of an oxide and a nitride of the element;
a first connection electrode layered on the first junction layer and used for electrical connection with outside;
a second junction layer including at least one element selected from valve action metals, the second junction layer being layered on the first semiconductor layer in such a manner that a side of the second junction layer being in contact with the first semiconductor layer includes at least any one of an oxide and a nitride of the element; and
a second connection electrode layered on the second junction layer and used for electrical connection with outside.

15. The semiconductor light emission element according to claim 14, wherein
the first semiconductor layer is formed of an n-type semiconductor layer using electrons as carriers, and
the second semiconductor layer is formed of a p-type semiconductor layer using positive holes as carriers.

16. The semiconductor light emission element according to claim 14, wherein the first junction layer and the second junction layer include at least one element selected from the group consisting of Al, Ti, Zn, Zr, Nb, W, Mg, Bi, Si, Hf and Ta.

17. The semiconductor light emission element according to claim 14, wherein the first junction layer and the second junction layer include any one of an oxide and a nitride of the same element.

18. The semiconductor light emission element according to claim 14, wherein the first connection electrode and the second connection electrode include any one of the same metal and the same alloy.

19. The semiconductor light emission element according to claim 14, wherein the transparent electrode includes the indium oxide and a zinc oxide.

20. The semiconductor light emission element according to claim 14, wherein the first semiconductor layer, the light emission layer and the second semiconductor layer are formed of a group III nitride semiconductor.

* * * * *